(12) United States Patent
Noh et al.

(10) Patent No.: US 10,877,585 B2
(45) Date of Patent: Dec. 29, 2020

(54) DISPLAY DEVICE

(71) Applicant: Samsung Display Co. Ltd., Yongin-si (KR)

(72) Inventors: Jung Hun Noh, Yongin-si (KR); Sung Chul Kim, Seongnam-si (KR); Keun Kyu Song, Seongnam-si (KR); Yi Joon Ahn, Seoul (KR); Hye Yong Chu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 19 days.

(21) Appl. No.: 15/972,962

(22) Filed: May 7, 2018

(65) Prior Publication Data

US 2019/0064991 A1 Feb. 28, 2019

(30) Foreign Application Priority Data

Aug. 28, 2017 (KR) .................. 10-2017-0108625

(51) Int. Cl.
| | |
|---|---|
| *G06F 3/041* | (2006.01) |
| *G06F 3/044* | (2006.01) |
| *H04R 7/06* | (2006.01) |
| *G06F 3/16* | (2006.01) |
| *H01L 27/32* | (2006.01) |

(52) U.S. Cl.
CPC .......... *G06F 3/0412* (2013.01); *G06F 3/0443* (2019.05); *G06F 3/0446* (2019.05); *G06F 3/04164* (2019.05); *G06F 3/162* (2013.01); *G06F 3/165* (2013.01); *H04R 7/06* (2013.01); *G06F 2203/04111* (2013.01); *H01L 27/323* (2013.01); *H04R 2499/15* (2013.01)

(58) Field of Classification Search
CPC ...... G06F 3/0416; G06F 3/165; G06F 3/0412; G06F 3/044; G06F 3/162; G06F 2203/04111; G06F 3/04164; G06F 3/0446; G06F 3/0443; G06F 1/1643; G06F 1/1688; H04R 7/06; H04R 2499/15; H04R 17/005; H04R 2499/11; H01L 27/323
See application file for complete search history.

(56) References Cited

U.S. PATENT DOCUMENTS

| 8,934,228 B2 | 6/2015 | Franklin et al. |
| 9,317,063 B2 | 4/2016 | Kwon et al. |
| 9,323,326 B2 * | 4/2016 | Cruz-Hernandez ..... G06F 3/016 |

(Continued)

FOREIGN PATENT DOCUMENTS

| EP | 2763379 | 8/2014 |
| EP | 2854418 | 4/2015 |

(Continued)

OTHER PUBLICATIONS

Extended European Search Report—EP EP18190385.7 dated Nov. 27, 2018, citing references listed within.

*Primary Examiner* — Grant Sitta

(74) *Attorney, Agent, or Firm* — Cantor Colburn LLP

(57) ABSTRACT

A display device includes a display panel, a touch sensing member which is disposed on the display panel and comprises a touch sensing area and a vibration area disposed around the touch sensing area and generating vibrations in response to a first audio signal, and a window which is disposed on the touch sensing member and outputs sound in response to the vibrations generated in the vibration area.

23 Claims, 26 Drawing Sheets

(56) References Cited

U.S. PATENT DOCUMENTS

| | | | |
|---|---|---|---|
| 9,720,533 B2* | 8/2017 | Ando | G06F 3/041 |
| 10,120,447 B2* | 11/2018 | Peshkin | G06F 3/016 |
| 2010/0156818 A1* | 6/2010 | Burrough | G06F 3/041 |
| | | | 345/173 |
| 2010/0225600 A1* | 9/2010 | Dai | G06F 3/0412 |
| | | | 345/173 |
| 2011/0012717 A1* | 1/2011 | Pance | G06F 3/04886 |
| | | | 340/407.2 |
| 2011/0079449 A1* | 4/2011 | Radivojevic | G06F 3/041 |
| | | | 178/18.03 |
| 2011/0261021 A1* | 10/2011 | Modarres | H01L 41/0825 |
| | | | 345/177 |
| 2012/0068957 A1* | 3/2012 | Puskarich | G06F 3/016 |
| | | | 345/174 |
| 2012/0268386 A1* | 10/2012 | Karamath | G06F 3/016 |
| | | | 345/173 |
| 2012/0268412 A1* | 10/2012 | Cruz-Hernandez | G06F 3/041 |
| | | | 345/174 |
| 2012/0283847 A1* | 11/2012 | Prieler | G05B 19/0423 |
| | | | 700/29 |
| 2013/0057509 A1* | 3/2013 | Cruz-Hernandez | G06F 3/0416 |
| | | | 345/174 |
| 2013/0106774 A1* | 5/2013 | Radivojevic | G06F 3/044 |
| | | | 345/174 |
| 2014/0079255 A1 | 3/2014 | Ando | |
| 2014/0375580 A1* | 12/2014 | Peshkin | G06F 3/0416 |
| | | | 345/173 |
| 2015/0009425 A1* | 1/2015 | Kwon | G02F 1/13338 |
| | | | 349/12 |
| 2015/0023531 A1* | 1/2015 | Horii | H04R 17/00 |
| | | | 381/190 |
| 2015/0116231 A1* | 4/2015 | Kim | G06F 3/016 |
| | | | 345/173 |
| 2015/0185955 A1* | 7/2015 | Ando | H03K 17/964 |
| | | | 345/174 |
| 2015/0185963 A1* | 7/2015 | Lee | H02J 50/40 |
| | | | 345/177 |
| 2016/0283025 A1* | 9/2016 | Yang | G06F 3/0416 |
| 2016/0313793 A1* | 10/2016 | Hong | G06F 3/016 |
| 2016/0349880 A1* | 12/2016 | Colgate | G06F 3/016 |
| 2017/0083098 A1* | 3/2017 | Usui | G06F 3/016 |
| 2017/0083140 A1* | 3/2017 | Leng | G06F 3/0412 |
| 2017/0178470 A1* | 6/2017 | Khoshkava | H04M 1/0268 |
| 2018/0121002 A1* | 5/2018 | Kim | G06F 3/0412 |
| 2018/0157359 A1* | 6/2018 | Lin | H01L 27/1225 |
| 2018/0356889 A1* | 12/2018 | Khoshkava | G06F 3/0412 |

FOREIGN PATENT DOCUMENTS

| | | |
|---|---|---|
| WO | 2014106691 | 7/2014 |
| WO | 2017111376 | 6/2017 |

* cited by examiner

DISPLAY DEVICE

This application claims priority to Korean Patent Application No. 10-2017-0108625, filed on Aug. 28, 2017, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

Electronic devices, such as a smart phone, a digital camera, a notebook computer, a navigation system and a smart television ("TV"), that provide images to users include a display device for displaying images. The display device generally includes a display panel which generates and displays an image and a touch sensing member which is disposed on the display panel.

SUMMARY

Typically, display devices only have a function of displaying images. To provide sound, a speaker is desired to be provided in an electronic device.

Exemplary embodiments of the invention provide a display device including a touch sensing member having both a touch function and an audio output function.

However, the invention is not restricted to the one set forth herein. The above and other exemplary embodiments of the invention will become more apparent to one of ordinary skill in the art to which the invention pertains by referencing the detailed description of the invention given below.

According to an exemplary embodiment of the invention, a display device includes a display panel, a touch sensing member which is located on the display panel and comprises a touch sensing area and a vibration area located around the touch sensing area and generating vibrations in response to a first audio signal, and a window which is located on the touch sensing member and outputs sound in response to the vibrations generated in the vibration area.

According to another exemplary embodiment of the invention, a display device includes a display panel, a touch sensing member which is located on the display panel and comprises touch electrodes and a piezoelectric polymer layer generating vibrations in response to a first audio signal, a diaphragm which is located on the touch sensing member and outputs sound in response to the vibrations generated by the piezoelectric polymer layer, and a touch control unit which receives a sensing signal generated by one of the touch electrodes in response to a touch event and detects a touch position in a touch sensing mode and generates the first audio signal and provides the generated first audio signal to the touch electrodes in an audio output mode.

BRIEF DESCRIPTION OF THE DRAWINGS

These and/or other features and advantages will become apparent and more readily appreciated from the following description of the exemplary embodiments, taken in conjunction with the accompanying drawings, in which.

DETAILED DESCRIPTION

Figure 1:
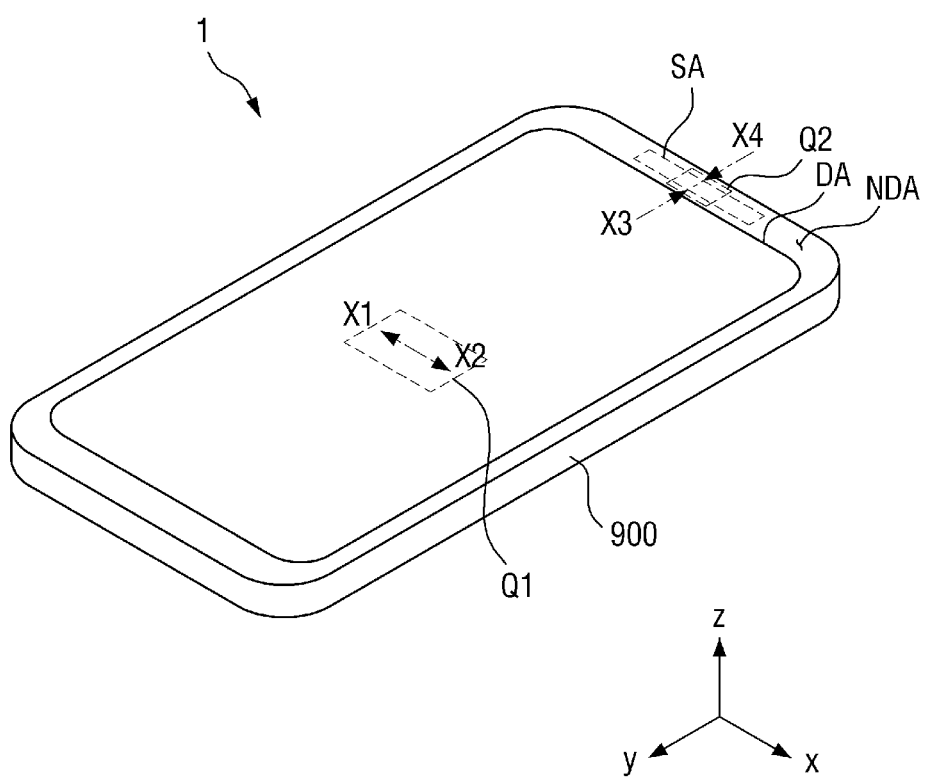
FIG. 1 is a perspective view of an exemplary embodiment of a display device.

Exemplary embodiments are described with reference to the accompanying drawings. The exemplary embodiments may be embodied in many different forms and should not be construed as being limited. Like reference numerals may refer to like elements in the description.

It will be understood that when an element is referred to as being "on" another element, it may be directly on the other element or intervening elements may be therebetween. In contrast, when an element is referred to as being "directly on" another element, there are no intervening elements present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Spatially relative terms, such as "beneath", "below", "lower", and "above", "upper", may be used to describe one element or feature's relationship to another element(s) or feature(s). The spatially relative terms may encompass different orientations of the device in use or operation in addition to the described orientation(s). For example, if the device is turned over, elements described as "below" or "beneath" other elements or features would then be positioned "above" the other elements or features. Thus, the term "below" can encompass both a position of above and below. The device may be otherwise oriented (e.g., rotated 90 degrees or at other orientations), and the spatially relative descriptors may be interpreted accordingly.

The terminology used herein is for the purpose of describing particular embodiments only and is not intended to be limiting. As used herein, the singular forms "a," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the drawing figures are schematic in nature and their shapes are not intended to illustrate the precise shape of a region and are not intended to limit the scope of the claims.

Throughout the specification, the same reference numerals in the drawings denote the same or similar elements.

Hereinafter, embodiments of the invention will be described with reference to the drawings.

Figure 2:
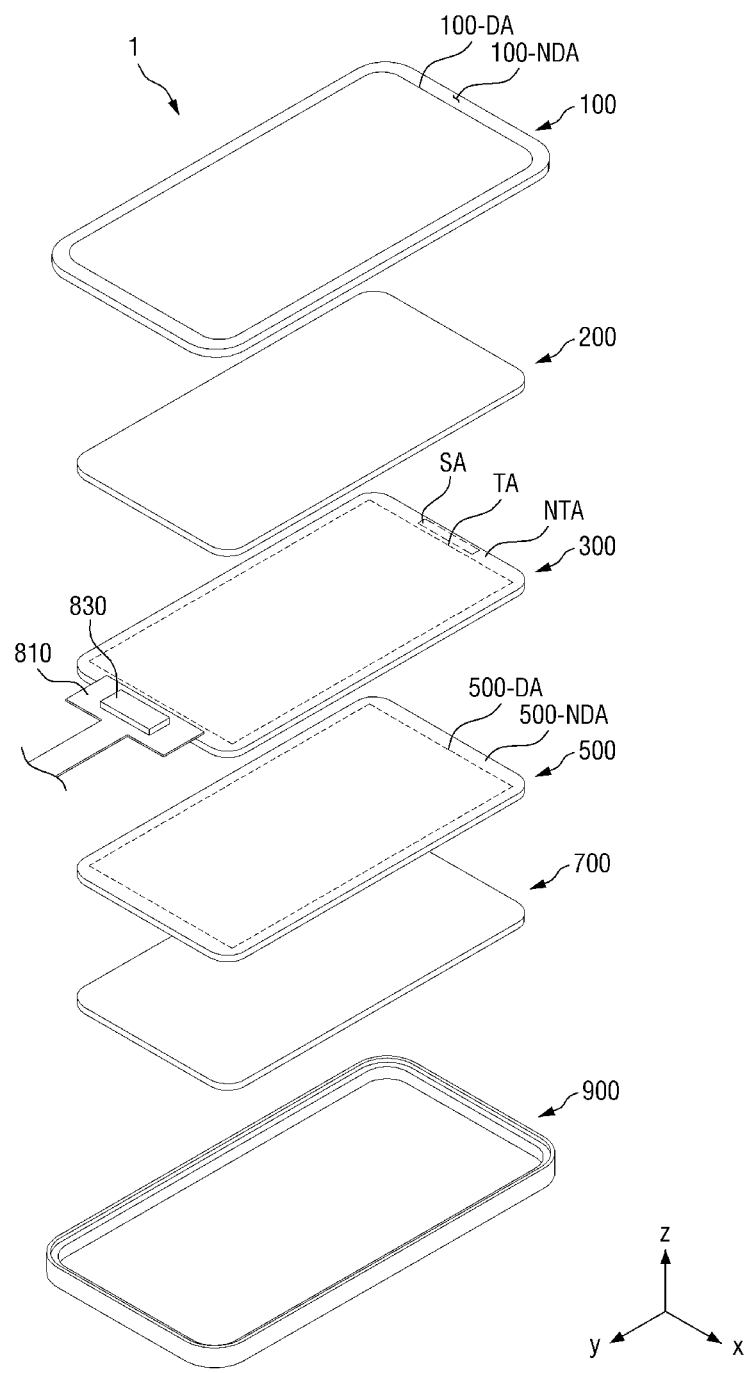
FIG. 2 is an exploded perspective view of the display device illustrated in FIG. 1.
Figure 3:
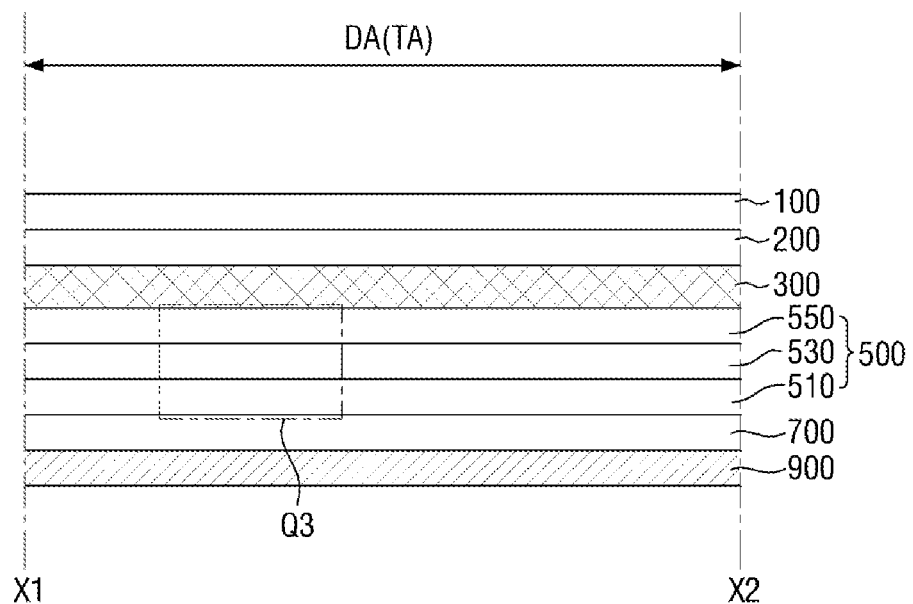
FIG. 3 is a cross-sectional view taken along line X1-X2 of FIG. 1.
Figure 4:
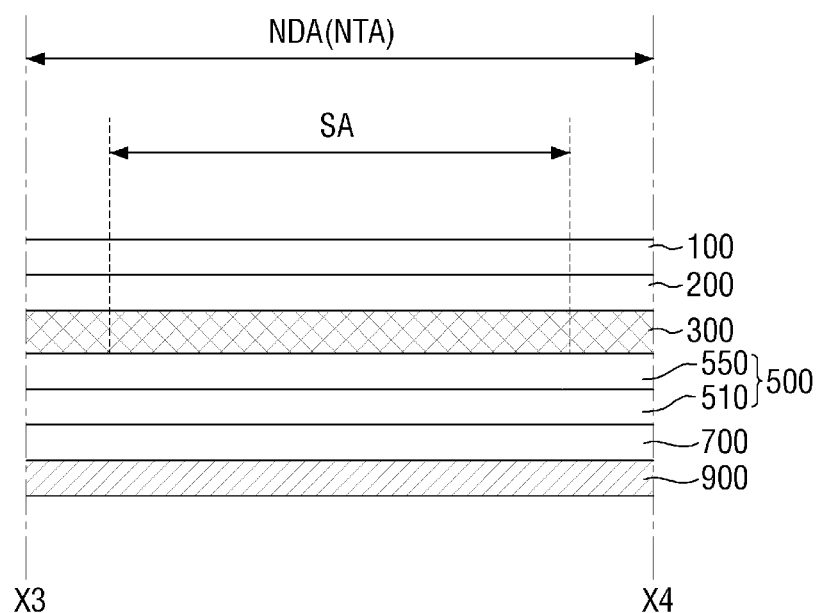
FIG. 4 is a cross-sectional view taken along line X3-X4 of FIG. 1.
Figure 5:
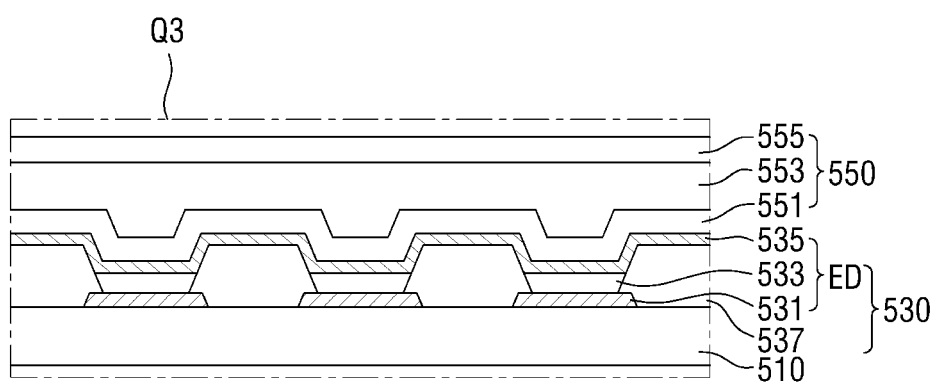
FIG. 5 is an enlarged cross-sectional view of a portion Q3 in FIG. 3.

FIG. 1 is a perspective view of a display device 1 according to an exemplary embodiment. FIG. 2 is an exploded perspective view of the display device 1 illustrated in FIG. 1. FIG. 3 is a cross-sectional view taken along line X1-X2 of FIG. 1. FIG. 4 is a cross-sectional view taken along line X3-X4 of FIG. 1. FIG. 5 is an enlarged cross-sectional view of a portion Q3 in FIG. 3.

In FIG. 1, a portable terminal is illustrated as an example to which the display device 1 according to the exemplary embodiment is applied. The portable terminal may be a tablet personal computer ("PC"), a smartphone, a personal digital assistant ("PDA"), a portable multimedia player ("PMP"), a game machine, a wrist watch type electronic device, or the like. However, the invention is not limited to the specific type of the display device 1. In an exemplary embodiment, the display device 1 may be used in large electronic devices such as a television and an external billboard as well as in small and medium-sized electronic devices such as a personal computer, a notebook computer, a car navigation device and a camera.

Referring to FIG. 1, the display device 1 may have a rectangular shape in plan view. The display device 1 may include both short sides extending in a second direction x and both long sides extending in a first direction y intersecting the second direction x. Corners at which the long sides and the short sides of the display device 1 meet may be at right angles. However, the corners may also form curved surfaces as illustrated in FIG. 1. The planar shape of the display device 1 is not limited to the above example and may have various other shapes such as a circular shape.

The display device 1 includes a display area DA in which an image is displayed and a non-display area. NDA which is adjacent to the display area DA and in which no image is displayed. In some exemplary embodiments, the non-display area. NDA may surround the display area DA.

The display device 1 may include a vibration area SA defined in a touch sensing member 300 to be described later. The vibration area SA is an area for implementing a speaker function such as audio output or a microphone function by vibration. In some exemplary embodiments, the vibration area SA may be located in the non-display area NDA of the display device 1.

In FIG. 1, the vibration area SA is illustrated as being adjacent to one short side of the display device 1 in the non-display area NDA. However, the position of the vibration area SA is not limited to this example and may be variously changed. In an exemplary embodiment, the vibration area SA may be located adjacent to each of the short sides of the display device 1 in the non-display area NDA, for example. In an alternative exemplary embodiment, the vibration area SA may be located adjacent to at least any one of the long sides of the display device 1 in the non-display area NDA, for example.

Although not illustrated in the drawing, in some exemplary embodiments, part of the vibration area SA may be located in the display area DA. In an alternative exemplary embodiment, the whole of the vibration area SA may belong to the display area DA, for example. For ease of description, the vibration area SA will be described below as being located in the non-display area NDA, but the invention is not limited to this case.

Referring to FIGS. 1 through 4, the display device 1 includes a display panel 500, the touch sensing member 300 located on the display panel 500, and a window 100 located on the touch sensing member 300. In addition, the display device 1 may further include a flexible circuit board 810 connected to the touch sensing member 300 and a touch control unit 830 mounted (e.g., disposed) on the flexible circuit board 810.

In some exemplary embodiments, the display device 1 may further include a bonding layer 200 located between the touch sensing member 300 and the window 100, The display device 1 may further include an under-panel member 700 disposed under the display panel 500 and a bracket 900 disposed under the under-panel member 700.

Unless otherwise defined, the terms "on," "above," "upper," "top," and "upper surface" used herein denote a display surface side of the display panel 500, that is, a z direction, and the terms "under," "below," "lower," "bottom," and "lower surface" used herein denote an opposite side of the display panel 500 from the display surface side, that is, a direction opposite to the z direction.

The display panel 500 includes a display portion 500-DA and a non-display portion 500-NDA. The display portion 500-DA is a portion where an image is disposed and overlaps a light-transmitting portion 100-DA of the window 100. The non-display portion 500-NDA is a portion where no image is displayed. The non-display portion 500-NDA is disposed adjacent to the display portion 500-DA and overlaps a light blocking portion 100-NDA of the window 100.

In some exemplary embodiments, the display panel 500 may include a base substrate 510, a light emitting element layer 530 disposed on the base substrate 510, and an encapsulation layer 550 disposed on the light emitting element layer 530. The light emitting element layer 530 for realizing an image may include a self-luminous element. The light emitting element layer 530 is located in the display area. DA of the display device 1 but is not located in the non-display area. NDA of the display device 1. In other words, the display portion 500-DA of the display panel 500 may include the base substrate 510, the light emitting element layer 530 and the encapsulation layer 550, and the non-display portion 500-NDA of the display panel 500 may include the base substrate 510 and the encapsulation layer 550 but may not include the light emitting element layer 530. In an exemplary embodiment, the self-luminous element may include at least one of an organic light emitting diode ("OLED"), a quantum dot light emitting diode, and an inorganic material-based ultra-small light emitting diode (e.g., a micro LED). For ease of description, the self-luminous element will be described below as an OLED. In addition, each element of the display panel 500 will be described in detail later with reference to FIG. 5.

The touch sensing member 300 is located on the display panel 500. More specifically, the touch sensing member 300 is located on the encapsulation layer 550 of the display panel 500. The touch sensing member 300 may include a touch sensing area TA and a peripheral area NTA around the touch sensing area TA. The touch sensing area TA may be an active area that generates sensing information in response to a touch event. The peripheral area. NTA may be an inactive area having no touch sensing function. The touch sensing area TA may be located in the display area DA of the display device 1, and the peripheral area NTA may be located in the non-display area NDA of the display device 1. In some exemplary embodiments, the touch sensing area TA may overlap the display portion 500-DA of the display panel 500, and the peripheral area NTA may overlap the non-display portion 500-NDA of the display panel 500.

The peripheral area NTA may include the vibration area SA described above. The vibration area SA may generate vibrations in response to an audio signal provided by the touch control unit 830.

The window 100 is located on the touch sensing member 300. The window 100 includes the light-transmitting portion 100-DA which transmits an image provided by the display panel 500 and a light blocking portion 100-NDA which is adjacent to the light-transmitting portion 100-DA. In some exemplary embodiments, an inner surface of the light blocking portion 100-NDA of the window 100 may include an opaque masking layer. The light-transmitting portion 100-DA may correspond to the display area. DA of the display device 1, and the light blocking portion 100-NDA may correspond to the non-display area NDA of the display device 1.

The flexible circuit board 810 is connected to a side of the touch sensing member 300. Although not illustrated in the drawings, terminal pads extending from wirings of the touch sensing member 300 may be disposed in the touch sensing member 300, and the flexible circuit board 810 may be connected to the terminal pads. The touch control unit 830 may be mounted (e.g., disposed) on the flexible circuit board 810. The touch control unit 830 controls the operation of the touch sensing member 300. The touch control unit 830 may receive a sensing signal sensed in the touch sensing area TA of the touch sensing member 300 and detect touch information (such as a touch position). In addition, the touch control unit 830 may provide an audio signal to the touch sensing member 300 so that vibrations are generated in the vibration area SA of the touch sensing member 300. In some exemplary embodiments, the touch control unit 830 may be mounted (e.g., disposed) on the flexible circuit board 810 using a chip-on-film ("COF") method, for example.

The window 100 may be disposed above the display panel 500 to protect the display panel 500. The window 100 may overlap the display panel 500 and cover the entire surface of the display panel 500. A size of the window 100 may be greater than a size of the display panel 500. In an exemplary embodiment, the window 100 may protrude outward from the display panel 500 at both short sides of the display device 1, for example.

The window 100 may also protrude from the display panel 500 at both long sides of the display device 1. However, the protruding distance may be greater at both short sides than at both long sides.

The window 100 receives vibrations generated in the vibration area SA of the touch sensing member 300. Then, the window 100 vibrates up and down to output sound. That is, the window 100 itself may function as a diaphragm of a speaker.

In an exemplary embodiment, the window 100 may include glass, sapphire, plastic, or the like, for example. The window 100 may be rigid, but may also be flexible.

The bonding layer 200 may be located between the touch sensing member 300 and the window 100. In some exemplary embodiments, the bonding layer 200 may be an optical clear adhesive ("OCA"), a pressure sensitive adhesive ("PSA"), or an optical clear resin ("OCR"), for example.

The touch sensing member 300 and the window 100 may be bonded to each other by the bonding layer 200. When the touch sensing member 300 and the window 100 are bonded to each other by the bonding layer 200, not only the bonding layer 200 is located between the touch sensing member 300 and the window 100. An element other than the bonding layer 200 may also be disposed between the touch sensing member 300 and the window 100. In an exemplary embodiment, when an element such as a polarizing member (not illustrated) is disposed between the touch sensing member 300 and the window 100, the touch sensing member 300 and the polarizing member may be bonded to each other by the bonding layer 200, and the polarizing member and the window 100 may be bonded to each other by another bonding layer, for example.

The under-panel member 700 may be disposed under the display panel 500 and may be coupled to the display panel 500. The under-panel member 700 may have substantially the same size as the display panel 500 and may overlap the display panel 500. Side surfaces of the under-panel member 700 may be, but not necessarily, aligned with side surfaces of the display panel 500. The under-panel member 700 may perform a heat dissipating function, an electromagnetic wave shielding function, a light shielding function or a light absorbing function, a buffering function, a digitizing function, and the like. The under-panel member 700 may include a functional layer having at least one of the above functions. In an exemplary embodiment, the functional layer may be provided in various forms such as a layer, a membrane, a film, a sheet, a plate, and a panel.

The bracket 900 may be located under the under-panel member 700. The bracket 900 houses the window 100, the touch sensing member 300, the display panel 500, and the under-panel member 700. The bracket 900 may include a bottom surface and side walls. The bottom surface of the bracket 900 faces a lower surface of the under-panel member 700, and the side walls of the bracket 900 face side surfaces of the window 100, the touch sensing member 300, the display panel 500 and the under-panel member 700.

In some exemplary embodiments, the bracket 900 may include a synthetic resin material, a metal material, or a combination of heterogeneous materials, for example.

In some exemplary embodiments, part of the bracket 900 may be exposed on the side surfaces of the display device 1 to form the lateral exterior of the display device 1. In addition, in some exemplary embodiments, an outer housing (not illustrated) may be coupled to the bottom of the bracket 900. However, this is only an example, and the bracket 900 itself may be applied as the outer housing of the display device 1 without the need to couple a separate element to the bottom of the bracket 900.

FIG. 5 is an enlarged cross-sectional view of the portion Q3 in FIG. 3, more specifically, an enlarged view of the schematic structure of the display panel 500 located in the display area DA.

Referring to FIG. 5, the display panel 500 may include the base substrate 510, the light emitting element layer 530 which includes a self-luminous element ED and a pixel defining layer 537, and the encapsulation layer 550. The self-luminous element ED may include a first electrode 531, a light emitting layer 533, and a second electrode 535.

The base substrate 510 may be an insulating substrate. The base substrate 510 may include a flexible polymer material in an exemplary embodiment. That is, in some exemplary embodiments, the base substrate 510 may be a flexible substrate. In an exemplary embodiment, the polymer material may be polyethersulphone ("PES"), polyacrylate ("PA"), polyarylate ("PAR"), polyetherimide ("PEI"), polyethylenenaphthalate ("PEN"), polyethyleneterephthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination of these materials, for example.

The first electrode 531 of the self-luminous element ED may be located on the base substrate 510. In some exemplary embodiments, the first electrode 531 may be an anode.

Although not illustrated in the drawing, a plurality of elements may further be disposed between the base substrate 510 and the first electrode 531. In an exemplary embodiment, the elements may include a buffer layer, a plurality of conductive wirings, an insulating layer, and a plurality of thin-film transistors, for example.

The pixel defining layer 537 may be located on the first electrode 531. An opening which exposes at least part of the first electrode 531 is defined in the pixel defining layer 537.

The light emitting layer 533 may be located on the first electrode 531.

In some exemplary embodiments, the light emitting layer 533 may emit one of red light, green light, and blue light, for example. In an exemplary embodiment, the wavelength of the red light may be about 620 micrometers (μm) to about 750 μm, and the wavelength of the green light may be about 495 μm to about 570 μm, for example. In an exemplary embodiment, the wavelength of the blue light may be about 450 μm to about 495 μm, for example.

In an alternative exemplary embodiment, the light emitting layer 533 may emit white light, for example. When emitting white light, the light emitting layer 533 may have a stacked structure of a red light emitting layer, a green light emitting layer, and a blue light emitting layer, for example. When the light emitting layer 533 emits white light, the light emitting element layer 530 may further include color filters for displaying red, green, and blue.

In some exemplary embodiments, the light emitting layer 533 may be an organic light emitting layer, for example. However, the invention is not limited thereto, and in another exemplary embodiment, the light emitting layer 533 may also be a quantum dot light emitting layer or an inorganic light emitting layer, for example.

The second electrode 535 may be disposed on the light emitting layer 533 and the pixel defining layer 537. The second electrode 535 may be disposed on the entire surface of the light emitting layer 533 and the pixel defining layer 537 in an exemplary embodiment. In some exemplary embodiments, the second electrode 535 may be a cathode, for example.

The first electrode 531, the second electrode 535 and the light emitting layer 533 may constitute the self-luminous element ED.

The encapsulation layer 550 may be located on the self-luminous element ED. The encapsulation layer 550 may seal the self-luminous element ED and prevent moisture or the like from entering the self-luminous element ED from the outside.

In some exemplary embodiments, the encapsulation layer 550 may be a thin-film encapsulation layer and may include one or more organic layers and one or more inorganic layers. In an exemplary embodiment, the encapsulation layer 550 may include a first inorganic layer 551, an organic layer 553, and a second inorganic layer 555.

The first inorganic layer 551 may be disposed on the self-luminous element ED and prevent the introduction of moisture, oxygen, and the like into the self-luminous element ED. In some exemplary embodiments, the first inorganic layer 551 includes an inorganic material. In an exemplary embodiment, the inorganic material may include any one or more of silicon oxide ($SiO_x$), silicon nitride ($SiN_x$), and silicon oxynitride ($SiON_x$), for example.

The organic layer 553 may be disposed on the first inorganic layer 551 and may improve flatness. The organic layer 553 includes an organic material. In an exemplary embodiment, the organic material may include any one of epoxy, acrylate, and urethane acrylate, for example.

The second inorganic layer 555 may be disposed on the organic layer 553. The second inorganic layer 555 may play substantially the same or similar role as the first inorganic layer 551 and may include substantially the same or similar material as the first inorganic layer 551. In some exemplary embodiments, the second inorganic layer 555 may completely cover the organic layer 553. In some exemplary embodiments, the second inorganic layer 555 and the first inorganic layer 551 may contact each other in the non-display area NDA to form an inorganic-inorganic junction. The inorganic-inorganic junction may effectively prevent moisture and the like from entering the display device 1 from outside the display device 1.

In FIG. 5, each of the first inorganic layer 551, the organic layer 553, and the second inorganic layer 555 is illustrated as a single layer. However, the invention is not limited to this case. That is, at least one of the first inorganic layer 551, the organic layer 553, and the second inorganic layer 555 may have a multilayer structure.

In addition, when at least one of the first inorganic layer 551 and the second inorganic layer 555 has a multilayer structure, the at least one of the inorganic layers having the multilayer structure may be a hexamethyldisiloxane ("HMDSO") layer, for example. The HMDSO layer may absorb stress. Therefore, the encapsulation layer 550 may become more flexible. In an alternative exemplary embodiment, the organic layer 553 may be changed to the HMDSO layer, for example.

Figure 6:
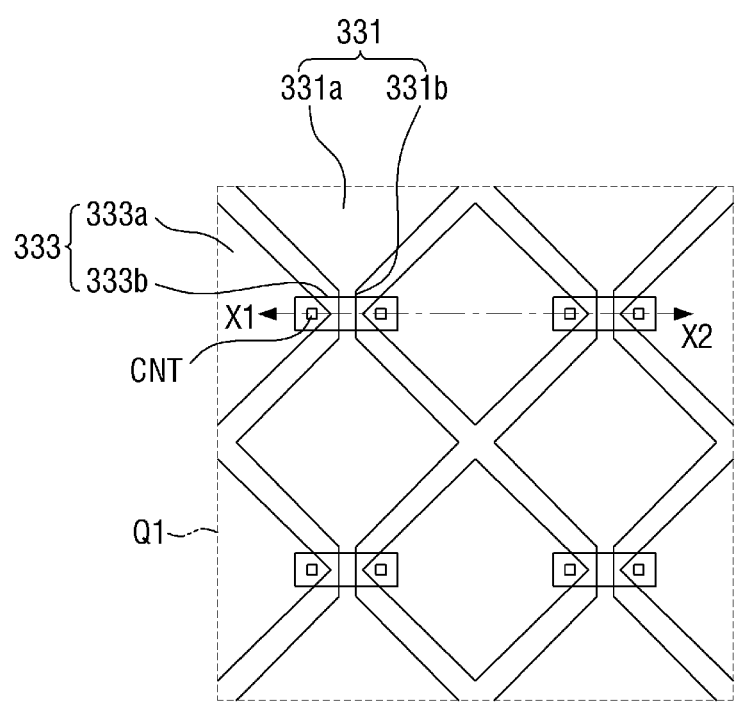
FIG. 6 is a plan view of a touch sensing member corresponding to a portion Q1 in FIG. 1.
Figure 6:
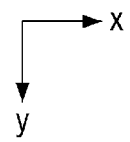
Figure 7:
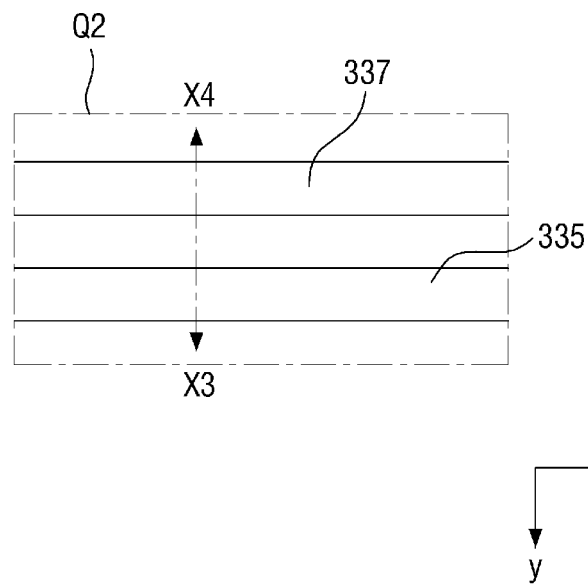
FIG. 7 is a plan view of the touch sensing member corresponding to a portion Q2 in FIG. 1.
Figure 8:
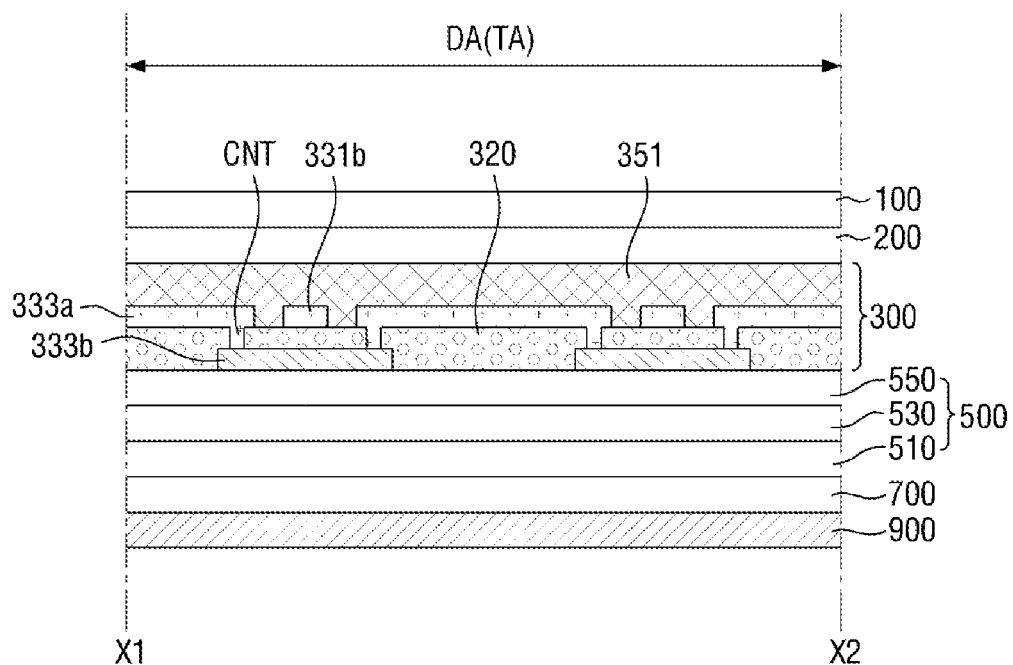
FIG. 8 is a cross-sectional view of the touch sensing member and the display device taken along line X1-X2 of FIGS. 1 and 6.
Figure 9:
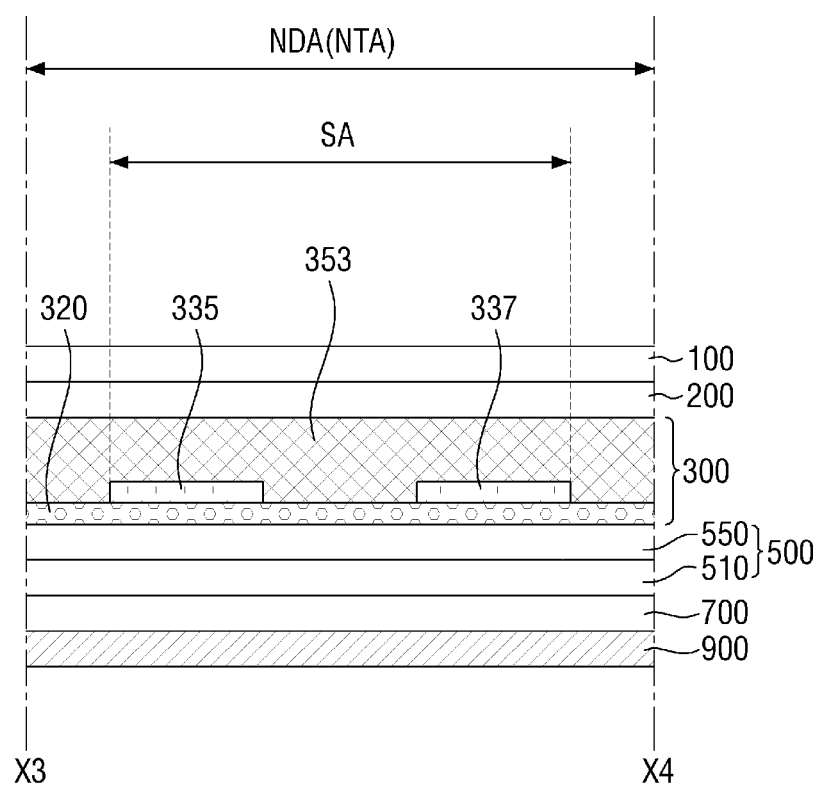
FIG. 9 is a cross-sectional view of the touch sensing member and the display device taken along line X3-X4 of FIGS. 1 and 7.

FIG. 6 is a plan view of the touch sensing member 300 corresponding to a portion Q1 in FIG. 1. FIG. 7 is a plan view of the touch sensing member 300 corresponding to a portion Q2 in FIG. 1. FIG. 8 is a cross-sectional view of the touch sensing member 300 and the display device 1 taken along line X1-X2 of FIGS. 1 and 6. FIG. 9 is a cross-sectional view of the touch sensing member 300 and the display device 1 taken along line X3-X4 of FIGS. 1 and 7.

Referring to FIGS. 6 through 9, the touch sensing member 300 includes touch electrodes 331 and 333, an insulating layer 320, and a second piezoelectric polymer layer 351 located in the touch sensing area TA. The touch sensing member 300 includes a first electrode 335, a second electrode 337, and a first piezoelectric polymer layer 353 located in the vibration area SA.

Of the elements of the touch sensing member 300, the elements located within the touch sensing area TA will now be described.

The touch electrodes 331 and 333 and the insulating layer 320 are located on the display panel 500. The touch electrodes 331 and 333 and the insulating layer 320 may be located on the encapsulation layer 550 of the display panel 500.

The touch electrodes 331 and 333 may include a plurality of first touch patterns 331a Which are arranged along the first direction y, a plurality of second touch patterns 333a Which are arranged along the second direction x intersecting the first direction y and are spaced apart from the first touch patterns 331a, a first connection portion 331b which connects the first touch patterns 331a adjacent to each other along the first direction y, and a second connection portion 333b which connects the second touch patterns 333a adjacent to each other along the second direction y. The first touch patterns 331a and the first connection portion 331b may constitute the first touch electrode 331, and the second touch patterns 333a and the second connection portion 333b may constitute the second touch electrode 333. In some exemplary embodiments, any one of the first touch electrode 331 and the second touch electrode 333 may be a driving electrode provided with a driving signal for touch detection, and the other may be a sensing electrode that generates a sensing signal in response to a touch event. The first touch electrode 331 will hereinafter be described as a sensing electrode, and the second touch electrode 333 will hereinafter be described as a driving electrode. However, the invention is not limited thereto, and in some other exemplary embodiments, the first touch electrode 331 may be the driving electrode, and the second touch electrode 333 may be the sensing electrode.

The first touch patterns 331a, the second touch patterns 333a, and the first connection portion 331b may be located in the same layer. When elements are disposed in the same layer, it means not only that the elements are located at the same level but also that layers located directly under the elements are the same. In addition, when elements are disposed in the same layer, it means that the elements are provided simultaneously in the same process by forming one layer and then patterning the layer.

The first touch patterns 331a, the second touch patterns 333a, and the first connection portion 331b may include the same conductive material. In an exemplary embodiment, the conductive material may include a metal material. Examples of the metal material may include molybdenum, silver, titanium, copper, aluminum, and alloys of these materials. In an alternative exemplary embodiment, the conductive material may include a transparent conductive oxide such as indium tin oxide ("ITO"), indium zinc oxide ("IZO"), zinc oxide ("ZnO"), or indium tin zinc oxide ("ITZO"), for example. In an alternative exemplary embodiment, the conductive material may include a conductive polymer such as PEDOT, metal nanowires, grapheme, or the like, for example. When the conductive material includes metal nanowires, the first touch patterns 331a, the second touch patterns 333a, and the first connection portion 331b may be provided in a metal mesh shape.

The second connection portion 333b may be located on a different layer from the first touch patterns 331a, the second touch patterns 333a, and the first connection portion 331b.

In an exemplary embodiment, the second connection portion 333b may be located on the encapsulation layer 550 of the display panel 500, and the insulating layer 320 may be located on the encapsulation layer 550 to cover the second connection portion 333b, for example. The first touch patterns 331a, the second touch patterns 333a, and the first connection portion 331b may be located on the insulating layer 320.

Like the first touch patterns 331a, the second touch patterns 333a and the first connection portion 331b, the second connection portion 333b may include a metal material, a transparent conductive oxide, a conductive polymer, metal nanowires, graphene, or the like.

The insulating layer 320 may insulate the second connection portion 333b and the first connection portion 331b from each other. In some exemplary embodiments, the insulating layer 320 may be disposed on the entire surface of the encapsulation layer 550 in the vibration area SA as illustrated in the drawings.

The insulating layer 320 may have a single layer structure or a multilayer structure. In addition, the insulating layer 320 may include at least any one of an inorganic material, an organic material, and a composite material. In an exemplary embodiment, the insulating layer 320 may include an inorganic material. In an exemplary embodiment, the insulating layer 320 may include at least one of aluminum oxide, titanium oxide, silicon oxide, silicon oxyitride, zirconium oxide, and hafnium oxide, for example.

In an exemplary embodiment, the insulating layer 320 may include an organic material, for example. In an exemplary embodiment, the insulating layer 320 may include at least any one of acrylic resin, methacrylic resin, polyisoprene, vinyl resin, epoxy resin, urethane resin, cellulose resin, siloxane resin, polyimide resin, polyamide resin, and perylene resin, for example.

The second piezoelectric polymer layer 351 is located on the insulating layer 320, the first touch patterns 331a, the second touch patterns 333a, and the first connection portion 331b. The second piezoelectric polymer layer 351 may include an electroactive polymer that is a polymeric material deformed by electrical stimulation. The electroactive polymer may have light transmitting properties. In an exemplary embodiment, the second piezoelectric polymer layer 351 may include a ferroelectric polymer such as polyvinylidene fluoride ("PVDF") or poly(vinylidenefluoride-co-trifluoroethylene (P(VDF-TrFE)), for example. When a voltage or an electric field is applied to the second piezoelectric polymer layer 351, the second piezoelectric polymer layer 351 generates vibrations through a converse piezoelectric effect. When an external force is applied to the second piezoelectric polymer layer 351, the second piezoelectric polymer layer 351 generates a voltage through a direct piezoelectric effect.

The bonding layer 200 is located on the second piezoelectric polymer layer 351, and the window 100 is located on the bonding layer 200.

Next, of the elements of the touch sensing member 300, the elements located in the vibration area SA will be described.

The insulating layer 320 is located on the encapsulation layer 550 of the display panel 500, and the first electrode 335 and the second electrode 337 spaced from each other are located on the insulating layer 320. The first electrode 335 and the second electrode 337 receive an audio signal from the touch control unit 830 (refer to FIG. 2).

The first electrode 335 and the second electrode 337 include the same material and located in the same layer as those of the first touch patterns 331a, the second touch patterns 333a and the first connection portion 331b. That is, the first electrode 335 and the second electrode 337 may be provided at the same time and in the same process as the first touch patterns 331a, the second touch patterns 333a and the first connection portion 331b.

The first piezoelectric polymer layer 353 is located on the insulating layer 320, the first electrode 335, and the second electrode 337. Like the second piezoelectric polymer layer 351, the first piezoelectric polymer layer 353 may include an electroactive polymer that is a polymer material deformed by electrical stimulation. In some exemplary embodiments, the first piezoelectric polymer layer 353 may include the same material as that of the second piezoelectric polymer layer 351. In addition, the first piezoelectric polymer layer 353 may be located in the same layer as the second piezoelectric polymer layer 351. That is, in some exemplary embodiments, the second piezoelectric polymer layer 351 and the first piezoelectric polymer layer 353 may be provided simultaneously in the same process.

The bonding layer is located on the second piezoelectric polymer layer 351, and the window 100 is located on the bonding layer 200.

Figure 10:
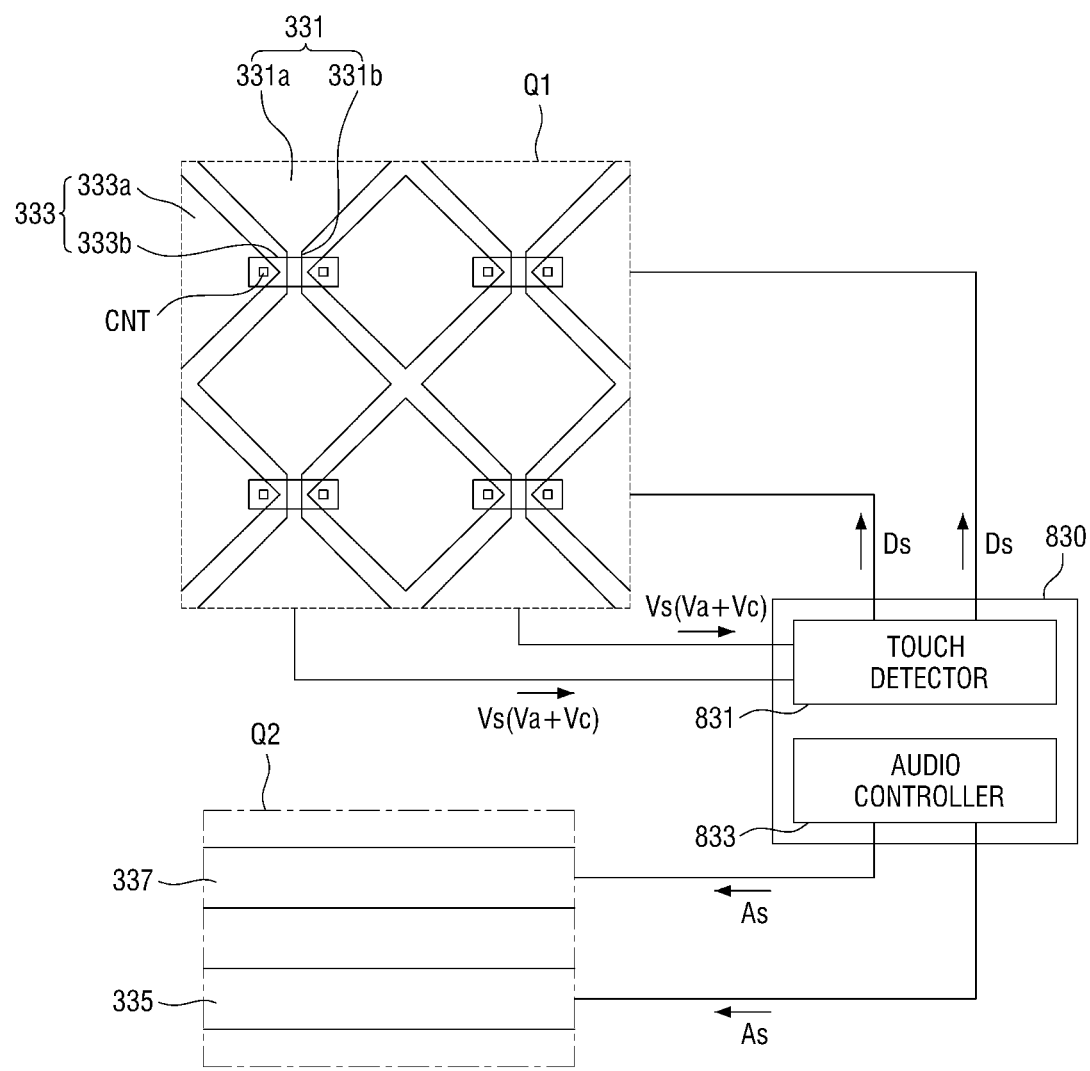
FIGS. 10 through 12 are views for explaining the operation of the touch sensing member illustrated in FIGS. 6, 7 and 9.
Figure 11:
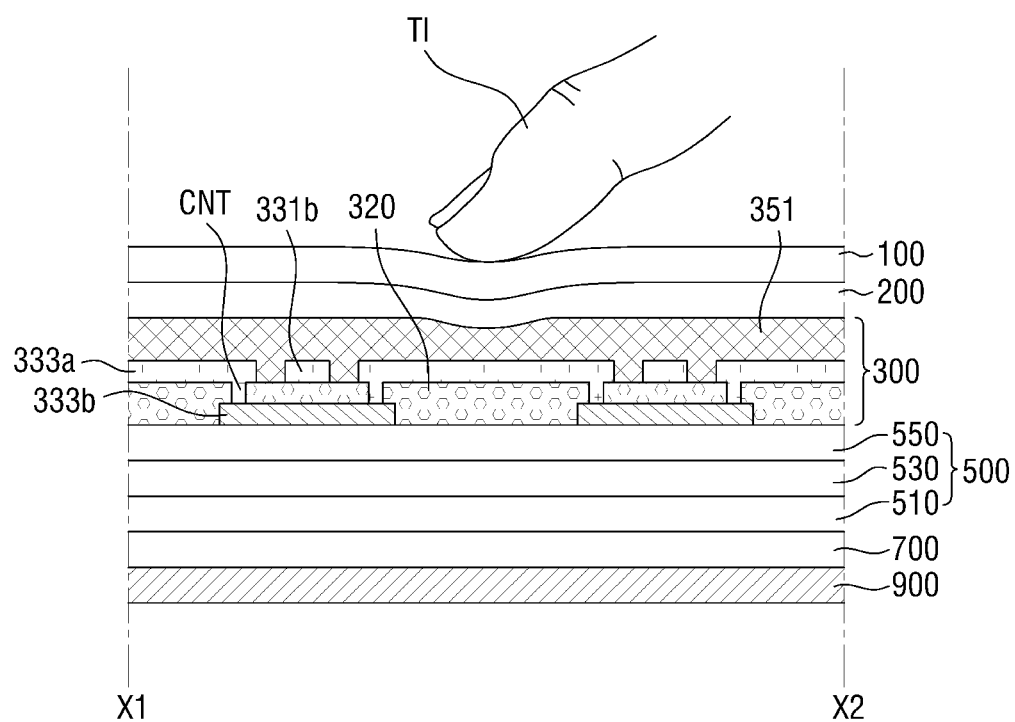
Figure 12:
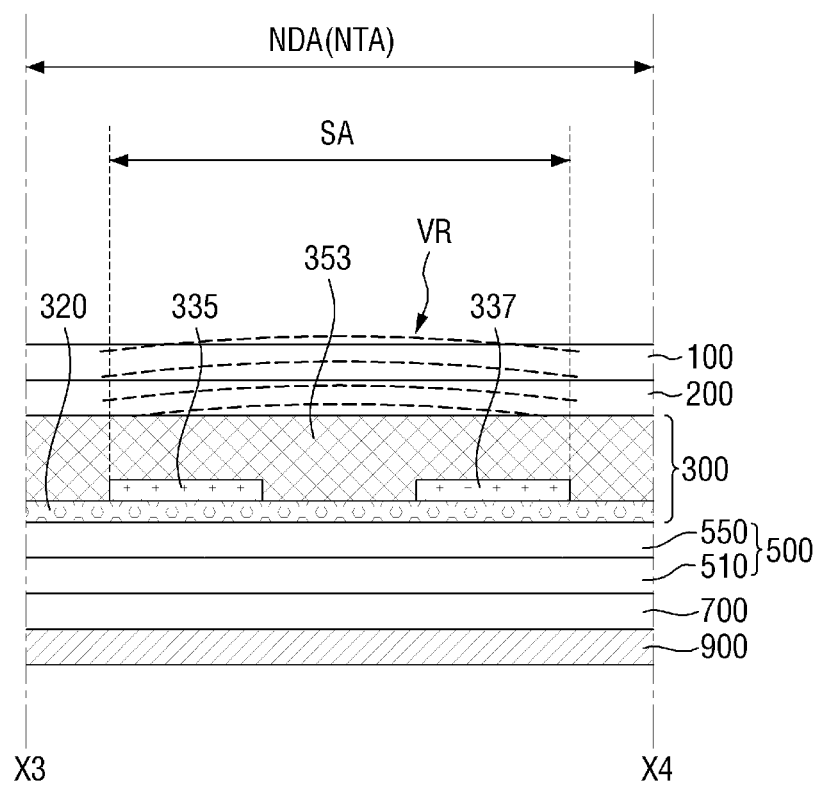

FIGS. 10 through 12 are views for explaining the operation of the touch sensing member 300 illustrated in FIGS. 6, 7 and 9. More specifically, FIG. 10 is a conceptual diagram for explaining a process in which the touch control unit 830 controls the touch sensing area TA and the vibration area SA of the touch sensing member 300. FIG. 11 schematically illustrates a case where a touch event occurs in the structure of FIG. 8. FIG. 12 schematically illustrates a process in which sound is generated in the structure of FIG. 9.

Referring to FIGS. 10 through 12, the touch control unit 830 may control the touch sensing area TA and the vibration area SA independently. Specifically, the touch control unit 830 includes a touch detector 831 which controls the operation of the touch sensing area TA and an audio controller 833 which controls the operation of the vibration area SA. The touch detector 831 and the audio controller 833 may operate independently. When the touch detector 831 and the audio controller 833 operate independently, it means that the operation of the touch detector 831 is not affected by the operation of the audio controller 833.

The operation of the touch control unit 830 related to the touch sensing area TA will first be described below.

When the first touch electrode 331 is a sensing electrode and the second touch electrode 333 is a driving electrode, the touch detector 831 provides a driving signal Ds to the second touch electrode 333. When a touch event TI occurs, a sensing signal Vs is generated by the first touch electrode 331. The touch detector 831 receives the sensing signal Vs and detects touch information.

The sensing signal Vs may include a first component Va and a second component Vc. In some exemplary embodiments, the first component Va may be an alternating current ("AC") component of the sensing signal Vs. and the second component Vc may be a direct current ("DC") component of the sensing signal Vs.

A mutual capacitance is generated between the first touch electrode 331 and the second touch electrode 333. When the touch event TI occurs, the mutual capacitance is changed. Accordingly, the first component Va of the sensing signal Vs output from the first touch electrode 331 changes. That is, the first component Va may be an AC component of the sensing signal Vs which reflects a change in the mutual capacitance caused by the touch event TI.

When the touch event TI occurs, the second piezoelectric polymer layer 351 located in the touch sensing area TA may receive pressure and generate a voltage through the direct piezoelectric effect. Accordingly, the second component Vc of the sensing signal Vs output from the first touch electrode 331 changes. The second component Vc may be a DC component of the sensing signal Vs which reflects a voltage change caused by the touch event TI.

The touch detector 831 may receive the sensing signal Vs generated in response to the touch event TI from the first touch electrode 331 and detect a touch position corresponding to the touch event TI by the amount of change of the first component Va of the sensing signal Vs. In addition, the touch detector 831 may detect touch pressure of the touch event TI by using the amount of change of the second component Vc of the sensing signal Vs received from the first touch electrode 331.

That is, according to the illustrated exemplary embodiment, since the second piezoelectric polymer layer 351 is located in the touch sensing area TA, the touch pressure as well as the touch position may be detected.

However, the invention is not limited thereto, and in some other exemplary embodiments, the touch detection operation of the touch detector 831 may be variously changed.

Next, the operation of the touch control unit 830 related to the vibration area SA will be described.

The audio controller 833 receives audio data from, e.g., an external circuit and generates an audio signal As which is an electrical signal corresponding to the audio data. The audio controller 833 provides the generated audio signal As to the first electrode 335 and the second electrode 337 located in the vibration area SA. The audio signal As may be an AC signal. When the audio signal As is provided to the first electrode 335 and the second electrode 337, the first piezoelectric polymer layer 353 may generate vibrations VR by repeating contraction and relaxation through the converse piezoelectric effect in response to the audio signal As. The vibrations VR generated by the first piezoelectric polymer layer 353 are transmitted to the window 100. Then, the window 100 vibrates up and down according to the vibrations VR, thereby outputting sound. That is, the window 100 itself functions as a diaphragm of a speaker to output sound.

Generally, the larger the size of a diaphragm of a speaker, the greater the intensity of pressure of sound output from the diaphragm, and the better the output characteristics of a low-frequency range of the sound. Therefore, the intensity of sound output through the window 100 and the output characteristics of the low-frequency range of the sound may be adjusted according to the area of the window 100. In particular, since the size of a diaphragm of a typical speaker applied to a general display device is very small as compared with the area of the window 100, the intensity of pressure or the output characteristics of the low-frequency range of the sound output from the display device 1 according to the exemplary embodiment which uses the window 100 as a diaphragm is superior to that of the sound output from the typical speaker.

In addition, since the display device 1 uses part of the window 100 as a diaphragm without including a speaker, the size of the display device 1 may be reduced, and the structure of the display device 1 may be simplified.

Furthermore, since the touch sensing member 300 of the display device 1 has both a touch function and a speaker function for audio output, the size of the display device 1 may be further reduced, and the structure of the display device 1 may be further simplified.

Figure 13:
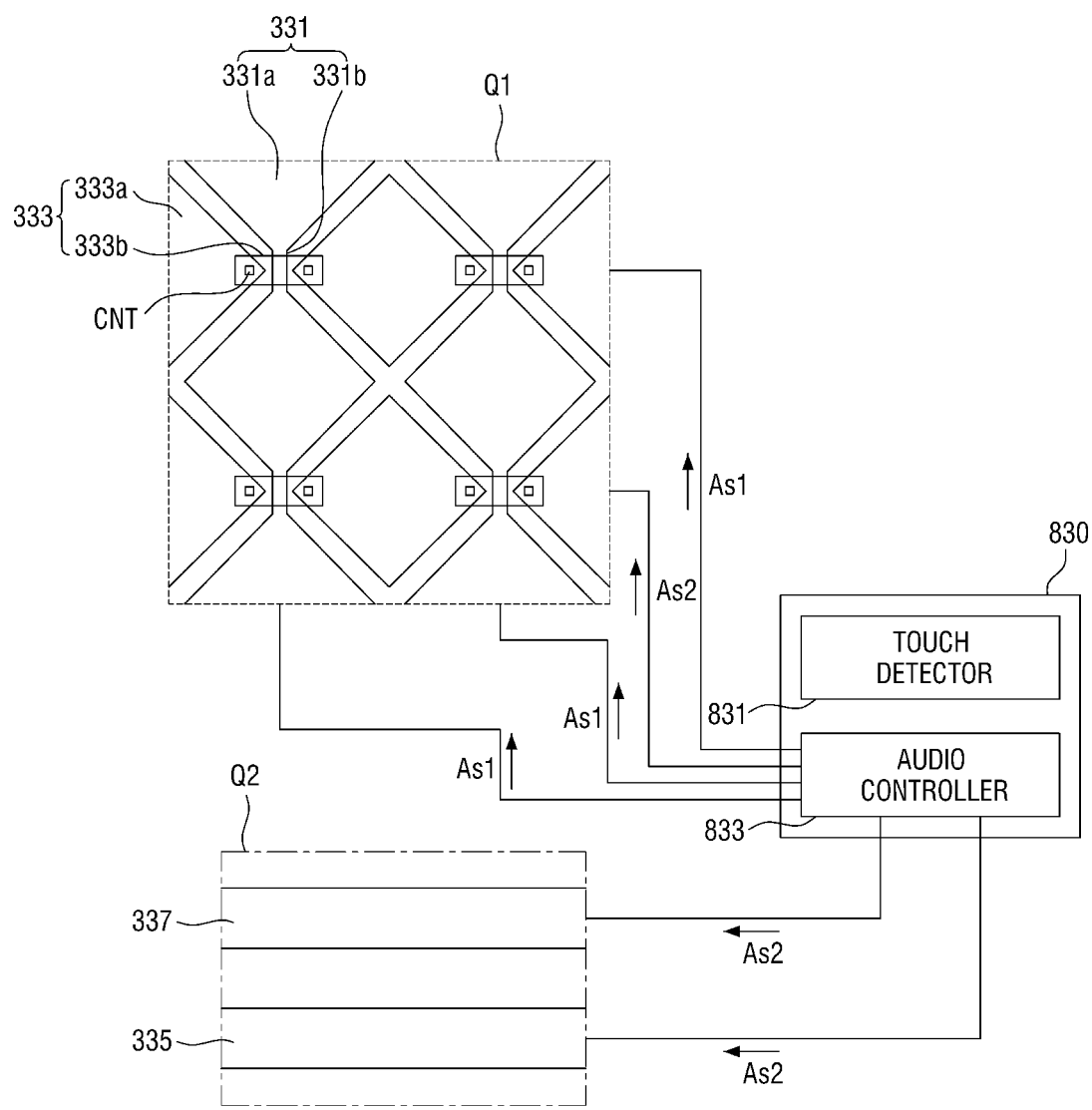
FIGS. 13 through 15 are views for explaining another operation of the touch sensing member illustrated in FIGS. 6 through 9.
Figure 14:
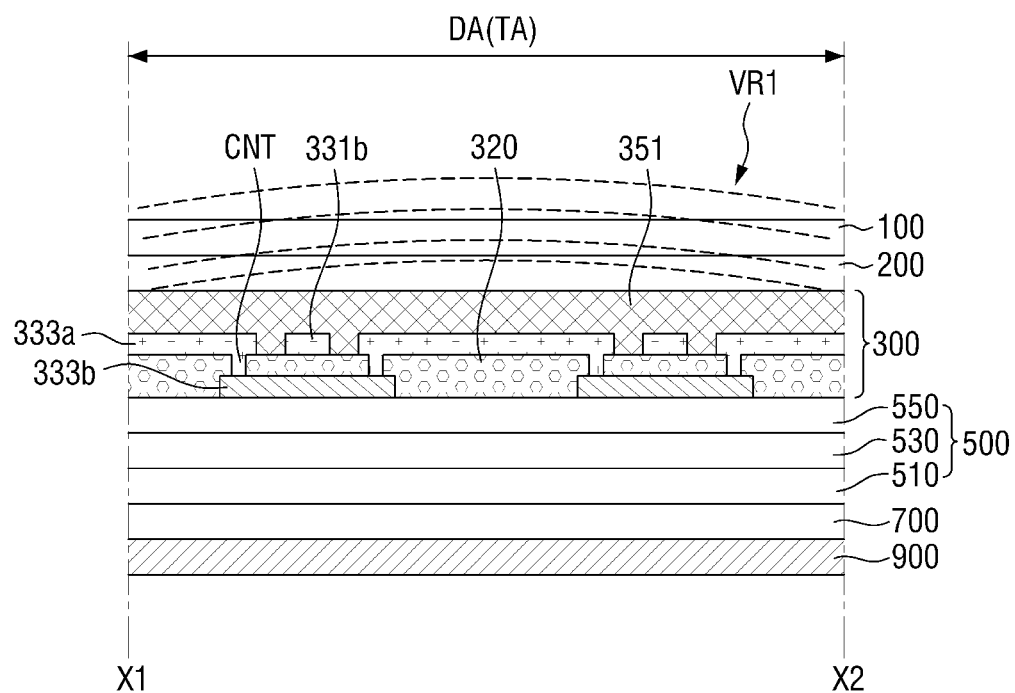
Figure 15:
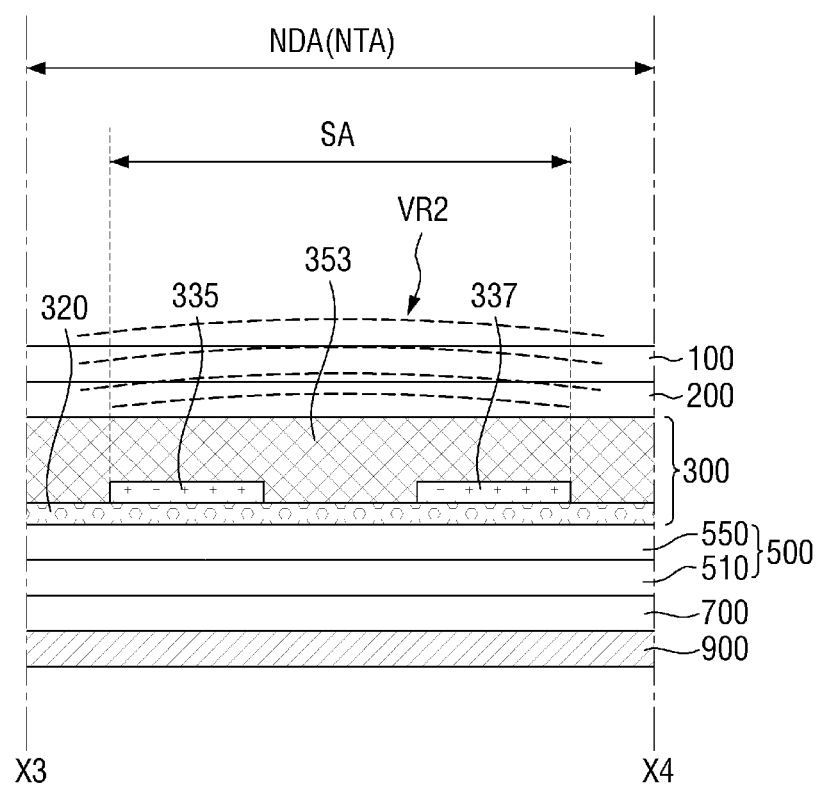

FIGS. 13 through 15 are views for explaining another operation of the touch sensing member 300 illustrated in FIGS. 6 through 9. More specifically, FIG. 13 is a conceptual diagram for explaining a process in which the touch control unit 830 controls the touch sensing area TA and the vibration area SA of the touch sensing member 300. FIG. 14 schematically illustrates a case where sound is generated in the structure of FIG. 8. FIG. 15 schematically illustrates a process in which sound is generated in the structure of FIG. 9.

Referring to FIGS. 13 through 15, the touch control unit 830 according to the illustrated exemplary embodiment may operate either in a touch sensing mode for performing touch sensing and an audio output mode for performing audio output. When the touch control unit 830 operates in the touch sensing mode, the touch detector 831 of the touch control unit 830 may provide a driving signal Ds (refer to FIG. 10) to the second touch electrode 333 which is the driving electrode, receive a sensing signal Vs generated by the first touch electrode 331 in response to a touch event TI, and detect touch information.

When the touch control unit 830 operates in the audio output mode, the audio controller 833 may generate an audio signal As1 and provide the generated audio signal As1 to the first touch electrode 331 and the second touch electrode 333. When the audio signal As1 is provided to the first touch electrode 331 and the second touch electrode 333, the second piezoelectric polymer layer 351 may generate vibrations VR1 by repeating contraction and relaxation through the converse piezoelectric effect in response to the audio signal As1. The vibrations VR1 generated by the second piezoelectric polymer layer 351 are transmitted to the window 100. Then, the window 100 vibrates up and down according to the vibrations VR1, thereby outputting sound.

That is, according to the illustrated exemplary embodiment, the touch sensing area TA may function as a vibration element for audio output. That is, sound may be output from the display area DA. Thus, the size of the display area DA may be increased as compared with a case where a speaker element is provided. When the touch sensing area TA functions as a vibration element, the elements located in the vibration area SA may be omitted in some exemplary embodiments.

When the first electrode 335, the second electrode 337 and the first piezoelectric polymer layer 353 are provided in the vibration area SA and when the touch control unit 830 operates in the audio output mode, the audio controller 833 may also provide an audio signal As2 to the first electrode 335 and the second electrode 337. Accordingly the first piezoelectric polymer layer 353 may vibrate to generate vibrations VR2, and the window 100 may receive the vibrations VR2 and vibrate up and down to output sound.

In some exemplary embodiments, when the first electrode 335, the second electrode 337 and the first piezoelectric polymer layer 353 are provided in the vibration area SA and when the touch control unit 830 operates in the audio output mode, the audio controller 833 may provide different audio signals to the touch sensing area TA and the vibration area SA. Accordingly, the vibrations VR1 generated by the second piezoelectric polymer layer 351 may be different from the vibrations VR2 generated by the first piezoelectric polymer layer 353. In addition, the window 100 corresponding to the touch sensing area TA and the window 100 corresponding to the vibration area SA may vibrate differently.

In an exemplary embodiment, when the touch control unit 830 operates in the audio output mode, the audio signal As1 provided to the first touch electrode 331 and the second touch electrode 333 and the audio signal As2 provided to the first electrode 335 and the second electrode 337 may be different from each other, for example. Accordingly, the vibrations VR1 generated by the second piezoelectric polymer layer 351 and the vibrations VR2 generated by the first piezoelectric polymer layer 353 may be different from each other, and the window 100 corresponding to the touch sensing area TA and the window 100 corresponding to the vibration area SA may vibrate differently. In addition, the sound output from the window 100 corresponding to the touch detection area TA and the sound output from the window 100 corresponding to the vibration area SA may be different from each other. Accordingly, the window 100 may output sound in stereo.

As described above, the larger the size of a diaphragm of a speaker, the greater the intensity of pressure of sound output from the diaphragm, and the better the output characteristics of the low-frequency range of the sound. Since the touch detection area TA may be relatively larger than the vibration area SA, the window 100 corresponding to the touch detection area TA may be larger than the window 100 corresponding to the vibration area. SA. That is, the sound output from the window 100 corresponding to the touch detection area TA may have relatively superior output characteristics in the low-frequency range. Therefore, when the touch control unit 830 operates in the audio output mode, the audio controller 833 may provide the audio signal As1 for outputting a relatively low-frequency sound to the first touch electrode 331 and the second touch electrode 333 and provide an audio signal As2 for outputting a high-frequency sound or sounds other than the low-frequency sound to the first electrode 335 and the second electrode 337.

Figure 16:
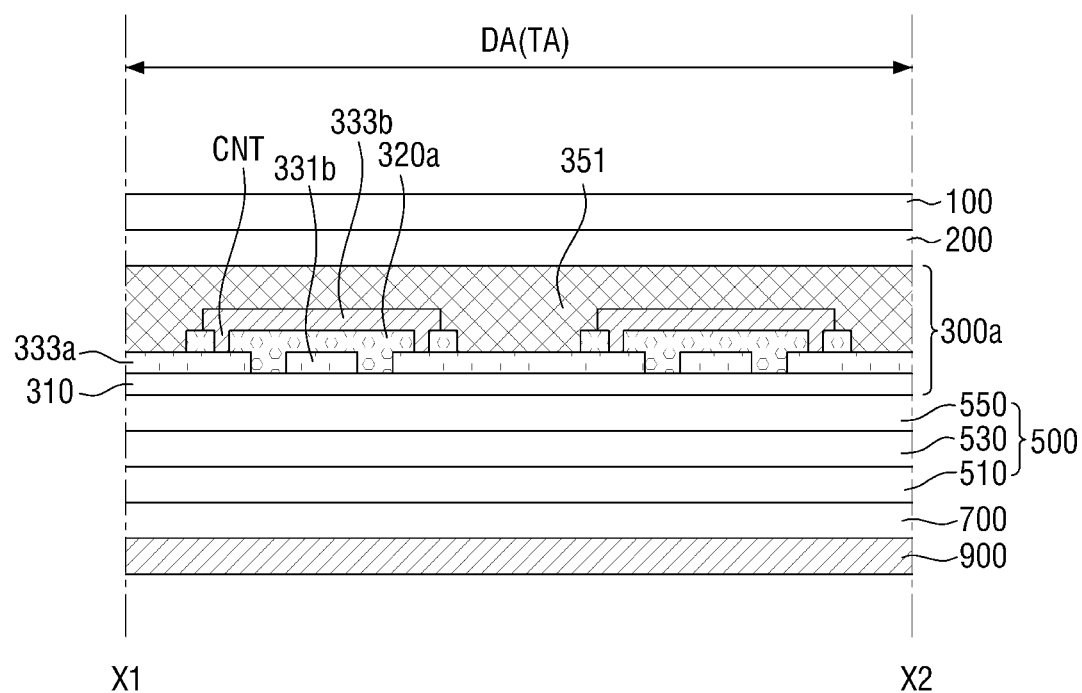
FIGS. 16 and 17 are cross-sectional views of a modified example of the structure illustrated in FIGS. 8 and 9.
Figure 17:
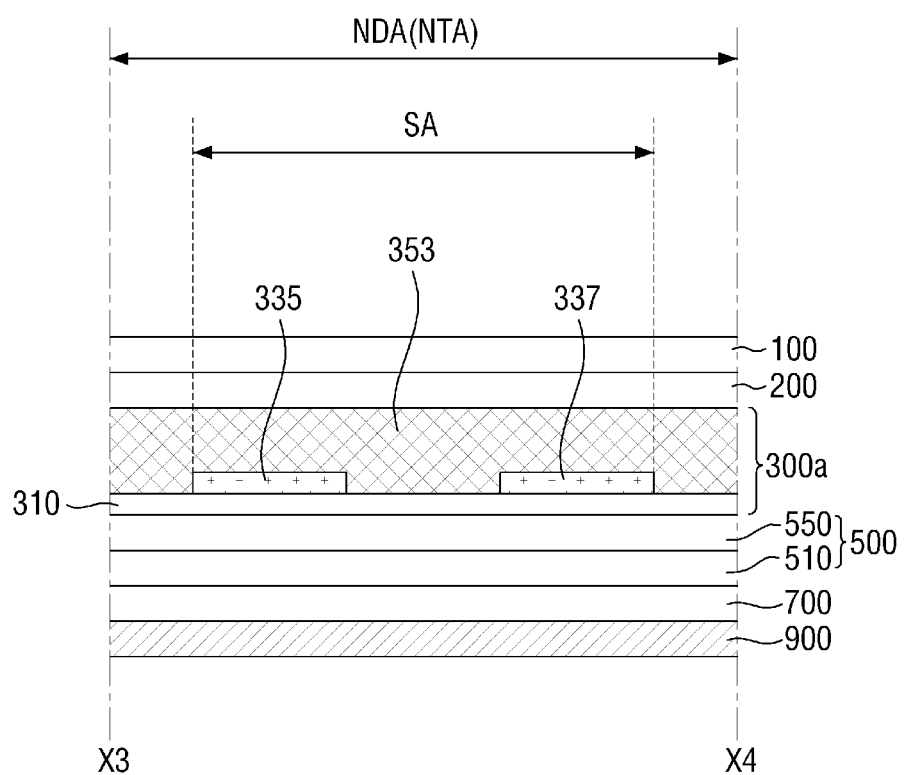

FIGS. 16 and 17 are cross-sectional views of a modified example of the structure illustrated in FIGS. 8 and 9, more specifically, a modified example of the touch sensing member 300.

Referring to FIGS. 16 and 17, a touch sensing member 300*a* is different from the touch sensing member 300 (refer to FIGS. 8 and 9) in that an insulating layer 320*a* of the touch sensing member 300*a* is provided in the form of patterns, the insulating layer 320*a* is located on a first connection portion 331*b*, and the touch sensing member 300*a* further includes a base 310. Other elements of the touch sensing member 300*a* are substantially identical or similar to those of the touch sensing member 300. Thus, any redundant description will be omitted, and the differences will mainly be described.

First, elements located within the touch sensitive area TA will be described.

The base 310 may be located on the encapsulation layer 550 of the display panel 500. The base 310 may be an insulating substrate. Examples of the insulating substrate are substantially the same or similar to those of the base substrate 510 (refer to FIG. 5) of the display panel 500 described above with reference to FIG. 5, and thus a detailed description of the examples will be omitted.

First touch patterns 331*a*, second touch patterns 333*a*, and the first connection portion 331*b* are located on a surface of the base 310 which faces the window 100.

Contact holes CNT which partially expose the second touch patterns 333*a* may be defined in the insulating layer 320*a* which is located on the first connection portion 331*b*. Examples of the material of the insulating layer 320*a* may be the same as those of the material of the insulating layer 320 described above with reference to FIGS. 6 through 9.

Unlike the insulating layer 320 described above with reference to FIGS. 6 through 9, the insulating layer 320*a* may be provided in the shape of island patterns. However, the invention is not limited to this case. In some exemplary embodiments, the insulating layer 320*a* may be disposed on the entire surface of the base 310 to cover the first touch patterns 331*a* and the second touch patterns 333*a*.

A second connection portion 333*b* may be located on the insulating layer 320*a* and may be connected to the second touch patterns 333*a* through the contact holes CNT.

A second piezoelectric polymer layer 351 may be located on the first touch patterns 331*a*, the second touch patterns 333*a* and the second connection portion 333*b*, and the bonding layer 200 and the window 100 may be located on the second piezoelectric polymer layer 351.

Next, elements located within the vibration area SA will be described. A first electrode 335 and a second electrode 337 may be disposed on the base 310 to be spaced apart from each other. The first electrode 335 and the second electrode 337 may be located in the same layer and include the same material as those of the first touch patterns 331*a*, the second touch patterns 333*a* and the first connection portion 331*b*, as described above.

A first piezoelectric polymer layer 353 may be located on the first electrode 335 and the second electrode 337. The bonding layer 200 may be located on the first piezoelectric polymer layer 353, and the window 100 may be located on the bonding layer 200.

Although not illustrated in the drawings, in some exemplary embodiments, a bonding layer may further be located between the touch sensing member 300*a* and the display panel 500. In an alternative exemplary embodiment, the base 310 may be omitted. In this case, the first touch patterns 331*a*, the second touch patterns 333*a*, the first connection portion 331*b*, the first electrode 335, and the second electrode 337 may be located on the encapsulation layer 550.

The operation of the touch sensing member 300*a* is substantially the same as that described above with reference to FIGS. 10 through 15 and thus will not be described again.

Figure 18:
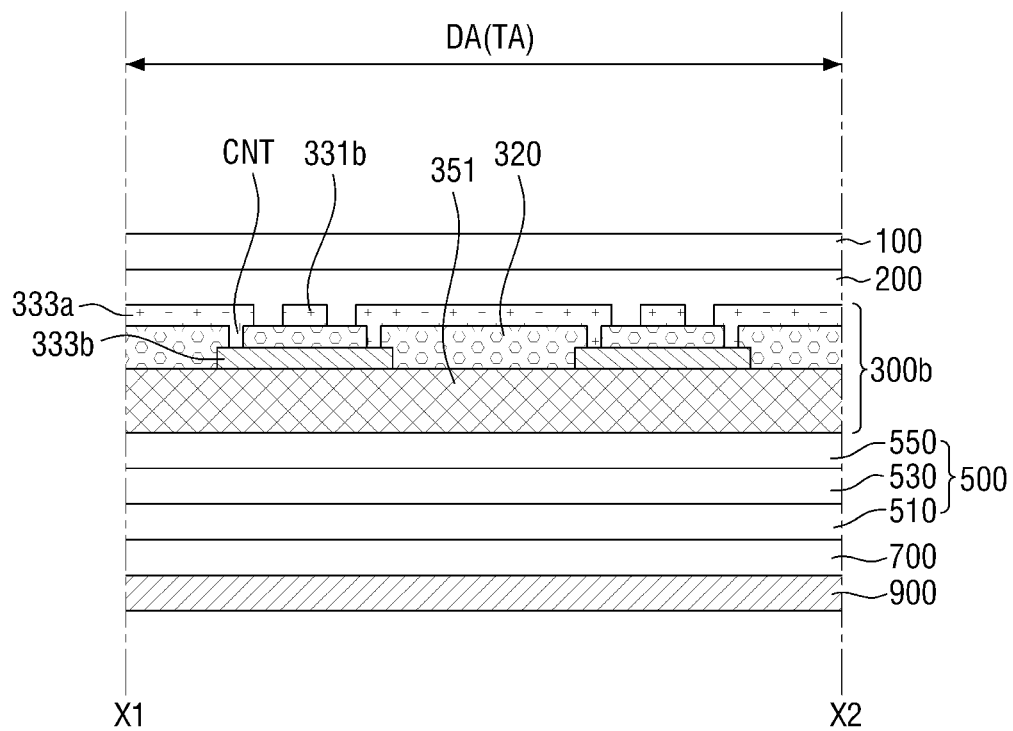
FIGS. 18 and 19 are cross-sectional views of a modified example of the structure illustrated in FIGS. 8 and 9.
Figure 19:
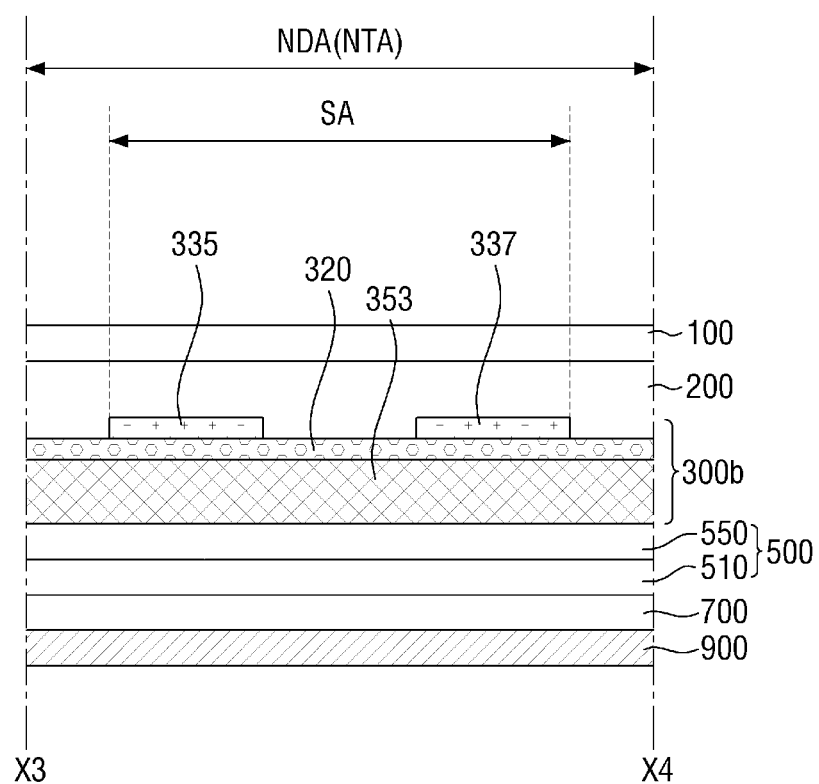

FIGS. 18 and 19 are cross-sectional views of a modified example of the structure illustrated in FIGS. 8 and 9, more specifically, a modified example of the touch sensing member 300.

Referring to FIGS. 18 and 19, a touch sensing member 300*b* is different from the touch sensing member 300 (refer to FIGS. 8 and 9) in the stacking order of elements. Other elements of the touch sensing member 300*b* are substantially identical or similar to those of the touch sensing member 300. Thus, any redundant description will be omitted, and the differences will mainly be described.

First, elements located within the touch sensing area TA will be described.

A second piezoelectric polymer layer 351 is located on the encapsulation layer 550 of the display panel 500.

A second connection portion 333*b* is located on the second piezoelectric polymer layer 351, and an insulating layer 320 is located on the second connection portion 333*b*. In some exemplary embodiments, the insulating layer 320 may be disposed on the entire surface of the second piezoelectric polymer layer 351 which faces the window 100. Contact holes CNT which partially expose the second connection portion 333*b* may be defined in the insulating layer 320.

First touch patterns 331*a*, second touch patterns 333*a* and a first connection portion 331*b* are located on the insulating layer 320, and the second touch patterns 333*a* are connected to the second connection portion 333*b* through the contact holes CNT.

The bonding layer 200 and the window 100 may be located on the first touch patterns 331*a*, the second touch patterns 333*a*, the first connection portion 331*b*, and the second piezoelectric polymer layer 351.

Next, elements located within the vibration area SA will be described. A first piezoelectric polymer layer 353 may be located on the encapsulation layer 550 of the display panel 500, and the insulating layer 320 may be located on the first piezoelectric polymer layer 353. In addition, a first electrode 335 and a second electrode 337 are located on the insulating layer 320 to be spaced apart from each other.

The bonding layer 200 and the window 100 may be located on the first electrode 335 and the second electrode 337.

The operation of the touch sensing member 300*b* is substantially the same as that described above with reference to FIGS. 10 through 15 and thus will not be described again.

Figure 20:
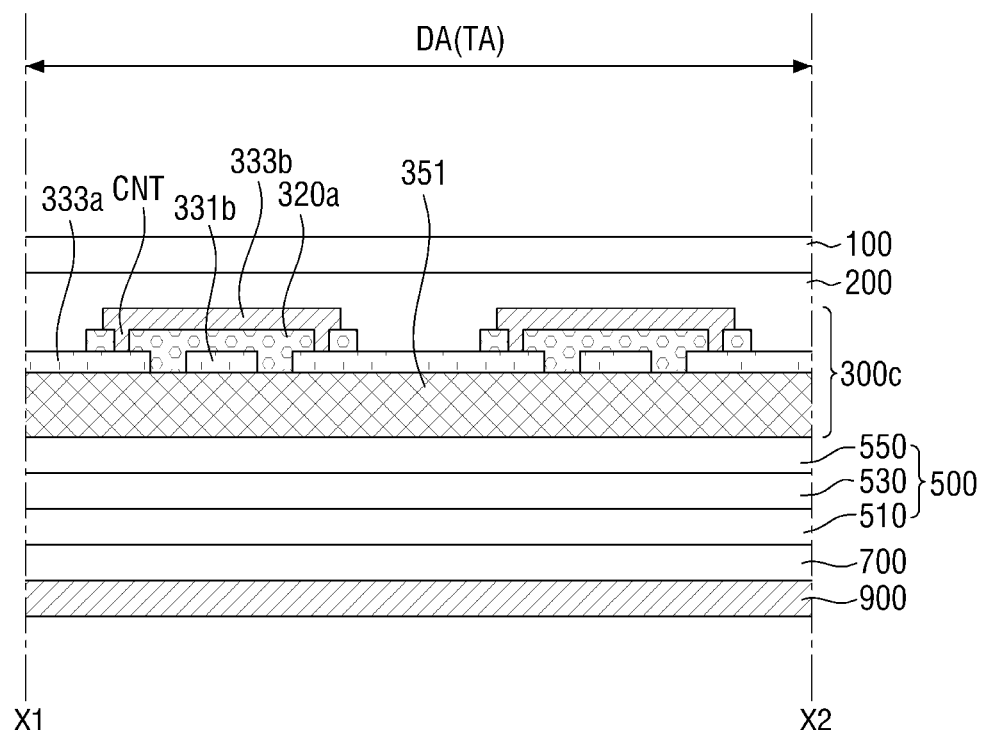
FIGS. 20 and 21 are cross-sectional views of a modified example of the structure illustrated in FIGS. 8 and 9.
Figure 21:
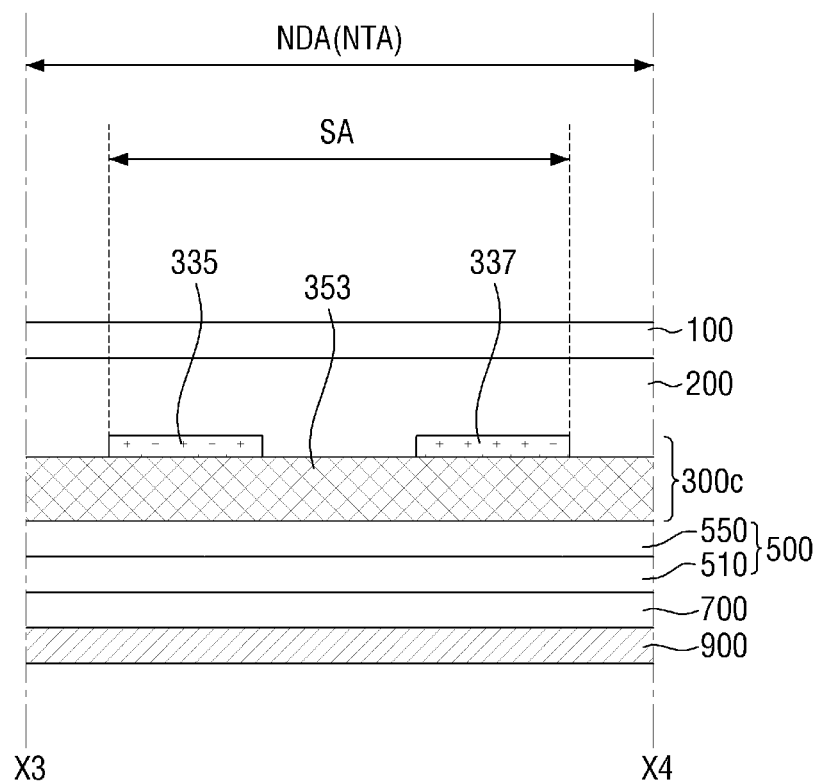

FIGS. 20 and 21 are cross-sectional views of a modified example of the structure illustrated in FIGS. 8 and 9, more specifically, a modified example of the touch sensing member 300.

Referring to FIGS. 20 and 21, a touch sensing member 300*c* is different from the touch sensing member 300 (refer to FIGS. 8 and 9) in the form of an insulating layer 320*a* and the stacking order of elements. Other elements of the touch sensing member 300*c* are substantially identical or similar to those of the touch sensing member 300. Thus, any redundant description will be omitted, and the differences will mainly be described.

First, elements located within the touch sensing area TA will be described.

A second piezoelectric polymer layer 351 is located on the encapsulation layer 550 of the display panel 500.

First touch patterns 331a, second touch patterns 333a, and a first connection portion 331b are located on the second piezoelectric polymer layer 351.

The insulating layer 320a is located on the first connection portion 331b. In some exemplary embodiments, the insulating layer 320a may be in the form of island patterns and may include contact holes CNT which partially expose the second touch patterns 333a.

A second connection portion 333b may be located on the insulating layer 320a and may be connected to the second touch patterns 333a through the contact holes CNT.

The bonding layer 200 and the window 100 may be located on the first touch patterns 331a, the second touch patterns 333a, the insulating layer 320a, and the second connection portion 333b.

Next, elements located within the vibration area SA will be described. A first piezoelectric polymer layer 353 is located on the encapsulation layer 550 of the display panel 500, and a first electrode 335 and a second electrode 337 are located on the first piezoelectric polymer layer 353 to be spaced apart from each other.

The bonding layer 200 and the window 100 may be located on the first electrode 335 and the second electrode 337.

The operation of the touch sensing member 300c is substantially the same as that described above with reference to FIGS. 10 through 15 and thus will not be described again.

Figure 22:
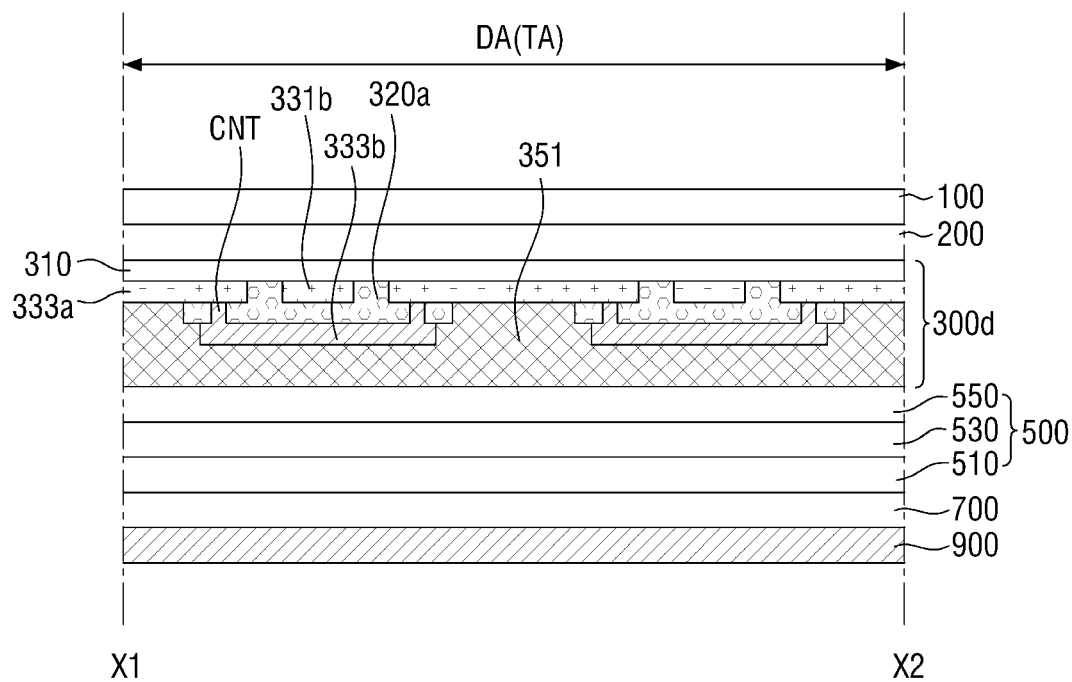
FIGS. 22 and 23 are cross-sectional views of a modified of the structure illustrated in FIGS. 8 and 9.
Figure 23:
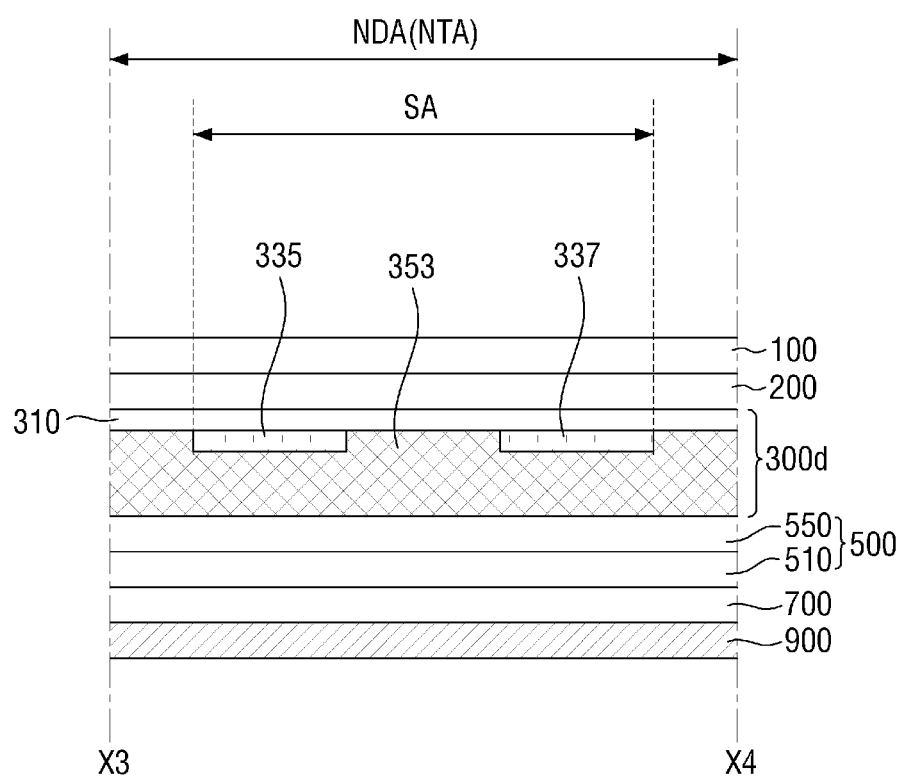

FIGS. 22 and 23 are cross-sectional views of a modified example of the structure illustrated in FIGS. 8 and 9.

Referring to FIGS. 22 and 23, a touch sensing member 300d is different from the touch sensing member 300 (refer to FIGS. 8 and 9) in that the touch sensing member 300d may include a base 310. In addition, the touch sensing member 300d is different from the touch sensing member 300 in the form of an insulating layer 320a and the stacking order of elements. Other elements of the touch sensing member 300d are substantially identical or similar to those of the touch sensing member 300. Thus, any redundant description will be omitted, and the differences will mainly be described.

First, elements located within the touch sensing area TA will be described.

The base 310 may be located on the encapsulation layer 550 of the display panel 500.

First touch patterns 331a, second touch patterns 333a and a first connection portion 331b are located on a surface (or a lower surface) of the base 310 which faces the display panel 500.

The insulating layer 320a is located under the first connection portion 331b. In some exemplary embodiments, the insulating layer 320a may be in the form of island patterns and may include contact holes CNT which partially expose the second touch patterns 333a.

A second connection portion 333b may be located under the insulating layer 320a and may be connected to the second touch patterns 333a through the contact holes CNT.

A second piezoelectric polymer layer 351 is located under the first touch patterns 331a, the second touch patterns 333a, the insulating layer 320a, and the second connection portion 333b. That is, the second piezoelectric polymer layer 351 may be located between the base 310 and the display panel 500.

The bonding layer 200 and the window 100 may be located on the other surface (or an upper surface) of the base 310 which faces the window 100.

Next, elements located within the vibration area SA will be described. A first electrode 335 and the second electrode 337 are located on the lower surface of the base 310 which faces the display panel 500.

A first piezoelectric polymer layer 353 is located under the first electrode 335 and the second electrode 337. That is, the first piezoelectric polymer layer 353 may be located between the base 310 and the display panel 500.

The bonding layer 200 and the window 100 may be located on the upper surface of the base 310 which faces the window 100.

The operation of the touch sensing member 300d is substantially the same as that described above with reference to FIGS. 10 through 15 and thus will not be described again.

Figure 24:
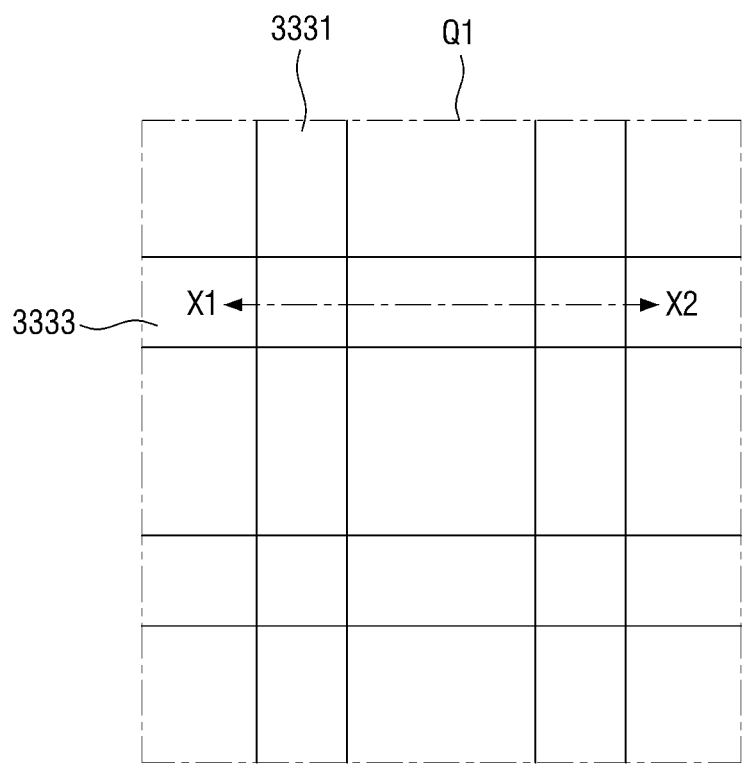
FIG. 24 is a plan view of a modified example of the structure illustrated in FIG. 6.
Figure 24:
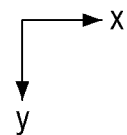
Figure 25:
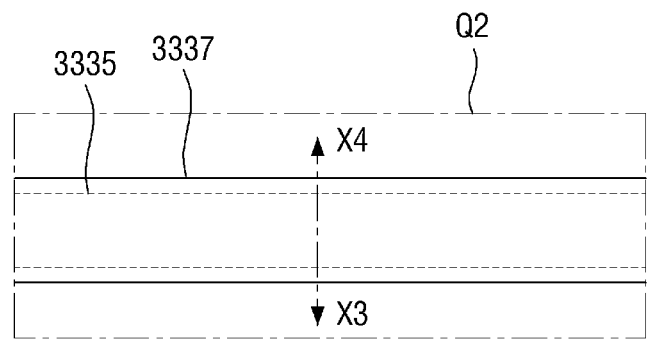
FIG. 25 is a plan view of a modified example of the structure illustrated in FIG. 7.
Figure 25:
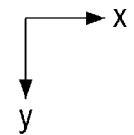
Figure 26:
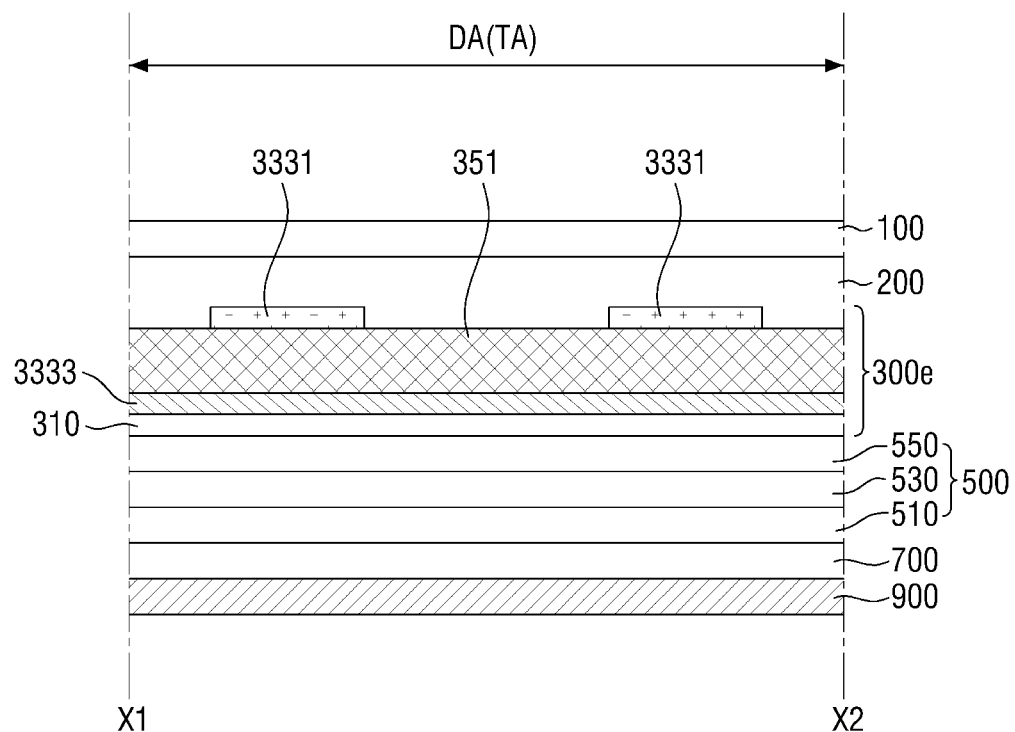
FIG. 26 is a cross-sectional view of a touch sensing member and a display device taken along line X1-X2 of FIGS. 1 and 24.
Figure 27:
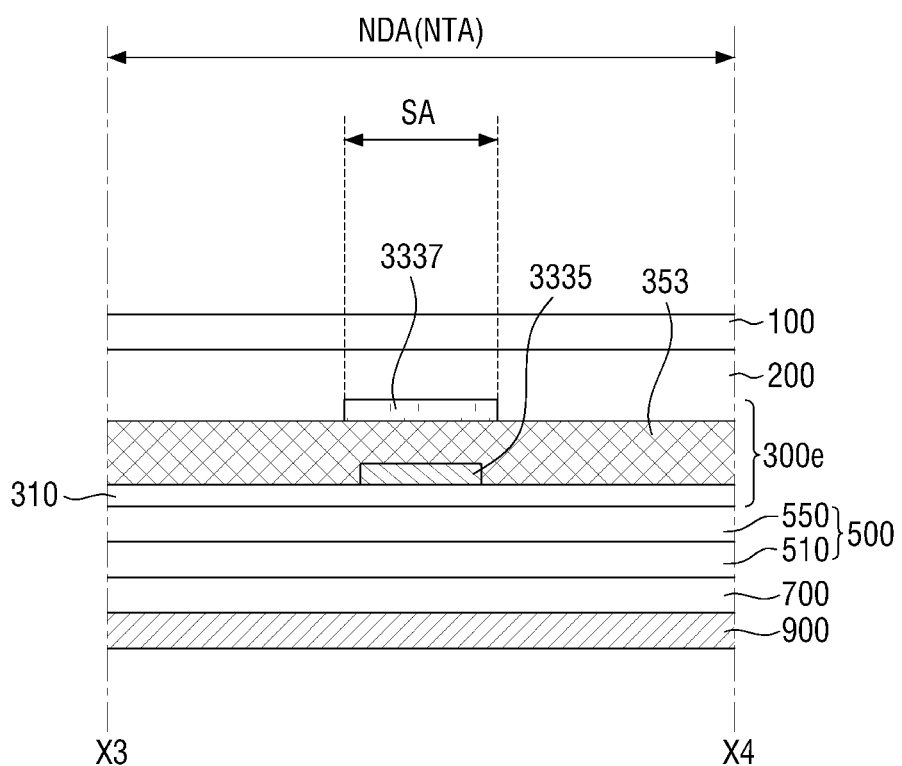
FIG. 27 is a cross-sectional view of the touch sensing member and the display device taken along line X1-X2 of FIGS. 1 and 25.

FIG. 24 is a plan view of a modified example of the structure illustrated in FIG. 6. FIG. 25 is a plan view of a modified example of the structure illustrated in FIG. 7. FIG. 26 is a cross-sectional view of a touch sensing member 300e and a display device taken along line X1-X2 of FIGS. 1 and 24. FIG. 27 is a cross-sectional view of the touch sensing member 300e and the display device taken along line X1-X2 of FIGS. 1 and 25.

Referring to FIGS. 24 through 27, the touch sensing member 300e is different from the touch sensing member 300 (refer to FIGS. 8 and 9) in that the touch sensing member 300e does not include a first connection portion and a second connection portion and that a first touch electrode 3331 and a second touch electrode 3333 are located on different layers. Other elements of the touch sensing member 300e are substantially identical or similar to those of the touch sensing member 300. Thus, any redundant description will be omitted, and the differences will mainly be described.

First, elements located within the touch sensing area TA will be described.

A base 310 may be located on the encapsulation layer 550 of the display panel 500.

The second touch electrode 3333 extending along the second direction x may be located on a surface (or a lower surface) of the base 310 which faces the window 100.

A second piezoelectric polymer layer 351 may be located on the surface of the base 310 and the second touch electrode 3333, and the first touch electrode 3331 extending along the first direction y may be located on the second piezoelectric polymer layer 351. In addition, the bonding layer 200 may be located on the first touch electrode 3331, and the window 100 may be located on the bonding layer 200. That is, in the illustrated exemplary embodiment, the first touch electrode 3331 and the second touch electrode 3333 may be located on different layers.

Next, elements located within the vibration area SA will be described. The base 310 is located on the encapsulation layer 550 of the display panel 500, and a first electrode 3335 is located on the base 310. The first electrode 3335 and the second touch electrode 3333 may be located in the same layer and may include the same material. Examples of the material of the first electrode 3335 and the second touch electrode 3333 are as described above.

A first piezoelectric polymer layer 353 may be located on the base 310 and the first electrode 3335.

A second electrode 3337 may be located on the first piezoelectric polymer layer 353. The second electrode 3337 may be located in the same layer and include the same material as that of the first touch electrode 3331. Examples of the material of the second electrode 3337 and the first touch electrode 3331 are as described above.

The bonding layer 200 may be located on the second electrode 3337, and the window 100 may be located on the bonding layer 200.

In some exemplary embodiments, the base 310 may be omitted. In this case, the second touch electrode 3333 and the first electrode 3335 may be located on the encapsulation layer 550 of the display panel 500. The operation of the touch sensing member 300e is substantially the same as that described above with reference to FIGS. 10 through 15 and thus will not be described again.

According to embodiments, it is possible to provide a display device including a touch sensing member having an audio function.

However, the effects of the exemplary embodiments are not restricted to the one set forth herein. The above and other effects of the exemplary embodiments will become more apparent to one of daily skill in the art to which the exemplary embodiments pertain by referencing the claims.

What is claimed is:

1. A display device comprising:
a display area and a non-display area disposed around the display area;
a display panel;
a touch sensing member which is disposed on the display panel and comprises a touch sensing area and a vibration area disposed around the touch sensing area and generating vibrations in response to a first audio signal; and
a window which is disposed on the touch sensing member and outputs sound in response to the vibrations generated in the vibration area,
wherein the touch sensing area and the vibration area are spaced apart from each other such that the touch sensing area and the vibration area do not overlap each other in a plan view,
wherein the touch sensing member further comprises:
a first electrode and a second electrode disposed in the vibration area and disposed in a same layer, and
wherein the touch sensing area is disposed in the display area, and the vibration area is disposed in the non-display area.

2. The display device of claim 1, further comprising a touch controller which receives a sensing signal output from the touch sensing area in response to a touch event and detects a touch position, and which generates the first audio signal and provides the generated first audio signal to the vibration area.

3. The display device of claim 2, wherein the touch controller detects the touch position by an alternating current component of the sensing signal and detects touch pressure of the touch event by a direct current component of the sensing signal.

4. The display device of claim 2, wherein, when the touch controller operates in an audio output mode, the touch controller further generates a second audio signal different from the first audio signal provided to the vibration area and provides the generated second audio signal to the touch sensing area.

5. The display device of claim 2, further comprising a flexible circuit board which is connected to the touch sensing member, wherein the touch controller is disposed on the flexible circuit board.

6. The display device of claim 1, wherein the display panel comprises a base substrate, a self-luminous element disposed on the base substrate and an encapsulation layer disposed on the self-luminous element, and the touch sensing member is disposed on the encapsulation layer.

7. A display device comprising:
a display panel;
a touch sensing member which is disposed on the display panel and comprises a touch sensing area and a vibration area disposed around the touch sensing area and generating vibrations in response to a first audio signal; and
a window which is disposed on the touch sensing member and outputs sound in response to the vibrations generated in the vibration area,
wherein the touch sensing member further comprises:
a first electrode and a second electrode which are disposed on the display panel, disposed in the vibration area, and spaced apart from each other;
a first piezoelectric polymer layer which is disposed between the first and second electrodes and the window and disposed in the vibration area;
touch electrodes which are disposed on the display panel, disposed in the touch sensing area, and spaced apart from the first electrode and the second electrode; and
a second piezoelectric polymer layer which is disposed between the touch electrodes and the window, disposed in the touch sensing area, and including the same material as that of the first piezoelectric polymer layer.

8. The display device of claim 7, wherein the first piezoelectric polymer layer generates the vibrations in response to the first audio signal provided to the first electrode and the second electrode.

9. The display device of claim 7, wherein the touch sensing member further comprises an insulating layer disposed on the display panel, and the touch electrodes comprise a first touch electrode which comprises a plurality of first touch patterns arranged along a first direction and a first connection portion connecting the first touch patterns adjacent to each other along the first direction and a second touch electrode which comprises a plurality of second touch patterns arranged along a second direction intersecting the first direction and a second connection portion connecting the second touch patterns adjacent to each other along the second direction, wherein the second connection portion is insulated from the first connection portion with the insulating layer interposed between the first connection portion and the second connection portion and intersects the first connection portion, wherein the first touch patterns, the second touch patterns, the first electrode, the second electrode and the first connection portion are disposed in the same layer, and the first connection portion and the second connection portion are disposed on different layers.

10. The display device of claim 9, wherein the first touch patterns, the second touch patterns, the first electrode, the second electrode and the first connection portion include the same material.

11. The display device of claim 9, wherein the second connection portion is disposed on the display panel, the insulating layer is disposed on the display panel and the second connection portion, the first touch patterns, the second touch patterns, the first electrode, the second electrode and the first connection portion are disposed on the insulating layer, the second piezoelectric polymer layer is disposed on the insulating layer, the first touch patterns, the second touch patterns and the first connection portion, and the first piezoelectric polymer layer is disposed on the insulating layer, the first electrode and the second electrode.

12. The display device of claim 10, wherein the first touch patterns, the second touch patterns, the first electrode, the second electrode and the first connection portion are disposed on the display panel, the insulating layer is disposed on the first connection portion, the second connection portion is disposed on the insulating layer, the second piezoelectric polymer layer is disposed on the first touch patterns, the second touch patterns, the insulating layer and the second connection portion, and the first piezoelectric polymer layer is disposed on the display panel, the first electrode and the second electrode.

13. A display device comprising:
a display panel;
a touch sensing member which is disposed on the display panel and comprises a touch sensing area and a vibration area disposed around the touch sensing area and generating vibrations in response to a first audio signal; and
a window which is disposed on the touch sensing member and outputs sound in response to the vibrations generated in the vibration area,
wherein the touch sensing member further comprises:
a first piezoelectric polymer layer which is disposed on the display panel and disposed in the vibration area;
a first electrode and a second electrode which are disposed between the first piezoelectric polymer layer and the window, disposed in the vibration area, and spaced apart from each other;
a second piezoelectric polymer layer which is disposed on the display panel, disposed in the touch sensing area, and including the same material as that of the first piezoelectric polymer layer; and
touch electrodes which are disposed between the second piezoelectric polymer layer and the window and disposed in the touch sensing area.

14. The display device of claim 13, wherein the touch sensing member further comprises an insulating layer disposed on the second piezoelectric polymer layer, and the touch electrodes comprise a first touch electrode which comprises a plurality of first touch patterns arranged along a first direction and a first connection portion connecting the first touch patterns adjacent to each other along the first direction and a second touch electrode which comprises a plurality of second touch patterns arranged along a second direction intersecting the first direction and a second connection portion connecting the second touch patterns adjacent to each other along the second direction, wherein the second connection portion is insulated from the first connection portion with the insulating layer interposed between the first connection portion and the second connection portion and intersects the first connection portion, wherein the first touch patterns, the second touch patterns, the first electrode, the second electrode and the first connection portion are disposed in the same layer, and the first connection portion and the second connection portion are located on different layers.

15. The display device of claim 14, wherein the second connection portion is located on the first piezoelectric polymer layer, the insulating layer is disposed on the first piezoelectric polymer layer, the second piezoelectric polymer layer and the second connection portion, the first touch patterns, the second touch patterns, the first electrode, the second electrode and the first connection portion are disposed on the insulating layer to overlap the second piezoelectric polymer layer, and the first electrode and the second electrode are disposed on the insulating layer to overlap the first piezoelectric polymer layer.

16. The display device of claim 14, wherein the first touch patterns, the second touch patterns and the first connection portion are disposed on the second piezoelectric polymer layer, the insulating layer is disposed on the first connection portion, the second connection portion is disposed on the insulating layer, and the first electrode and the second electrode are disposed on the first piezoelectric polymer layer.

17. The display device of claim 14, wherein the touch sensing member further comprises a base which is placed to face the display panel, wherein the first touch patterns, the second touch patterns and the first connection portion are disposed on a surface of the base which faces the display panel, the insulating layer is disposed on the first connection portion, the second connection portion is disposed on the insulating layer, the second piezoelectric polymer layer is disposed between the surface of the base and the display panel, the first electrode and the second electrode are disposed on the surface of the base, and the first piezoelectric polymer layer is disposed between the surface of the base and the display panel.

18. A display device comprising:
a display panel;
a touch sensing member which is disposed on the display panel and comprises a touch sensing area and a vibration area disposed around the touch sensing area and generating vibrations in response to a first audio signal; and
a window which is disposed on the touch sensing member and outputs sound in response to the vibrations generated in the vibration area,
wherein the touch sensing member further comprises:
a first piezoelectric polymer layer which is disposed on the display panel and disposed in the vibration area;
a first electrode which is disposed between the first piezoelectric polymer layer and the window and disposed in the vibration area;
a second electrode which is disposed between the first piezoelectric polymer layer and the display panel and disposed in the vibration area;
a second piezoelectric polymer layer which is disposed on the display panel, disposed in the touch sensing area, and including the same material as that of the first piezoelectric polymer layer;
a first touch electrode which is disposed between the second piezoelectric polymer layer and the window and disposed in the touch sensing area; and
a second touch electrode which is disposed between the second piezoelectric polymer layer and the display panel and disposed in the touch sensing area.

19. The display device of claim 18, wherein the first electrode and the first touch electrode are disposed in the same layer, and the second electrode and the second touch electrode are disposed in the same layer.

20. The display device of claim 19, wherein the first electrode and the first touch electrode include the same material, and the second electrode and the second touch electrode include the same material.

21. A display device comprising:
a display panel;
a touch sensing member which is disposed on the display panel and comprises touch electrodes and a piezoelectric polymer layer generating vibrations in response to a first audio signal;

a diaphragm which is disposed on the touch sensing member and outputs sound in response to the vibrations generated by the piezoelectric polymer layer;

a touch controller which receives a sensing signal generated by one of the touch electrodes in response to a touch event and detects a touch position in a touch sensing mode and generates the first audio signal and provides the generated first audio signal to the touch electrodes in an audio output mode; and a window which is disposed on the touch sensing member, wherein the piezoelectric polymer layer is disposed on the display panel, wherein the touch electrodes include a first touch electrode and a second touch electrode which only partially overlap in a plan view, wherein the second touch electrode includes a first touch pattern and a first connection portion between which an insulating layer is disposed, the first touch pattern and the first connection portion are connected to each other via a contact hole defined in the insulating layer, and the first touch electrode is disposed between the display panel and the piezoelectric polymer layer and the second touch electrode is disposed between the piezoelectric polymer layer and the window.

22. The display device of claim 21, further comprising a flexible circuit board which is connected to the touch sensing member, wherein the touch controller is disposed on the flexible circuit board.

23. The display device of claim 21, wherein the diaphragm is part of the window.

* * * * *